(12) United States Patent
Ehsan et al.

(10) Patent No.: US 11,591,701 B2
(45) Date of Patent: Feb. 28, 2023

(54) PD-COMPRISING ELECTROCATALYSTS SUITABLE FOR WATER SPLITTING

(71) Applicant: King Fahd University of Petroleum and Minerals, Dhahran (SA)

(72) Inventors: Muhammad Ali Ehsan, Dhahran (SA); Khurram Saleem Joya, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 72 days.

(21) Appl. No.: 16/418,552

(22) Filed: May 21, 2019

(65) Prior Publication Data
US 2020/0370189 A1    Nov. 26, 2020

(51) Int. Cl.
C25B 11/093 (2021.01)
C25B 1/04 (2021.01)

(52) U.S. Cl.
CPC ............ *C25B 11/093* (2021.01); *C25B 1/04* (2013.01)

(58) Field of Classification Search
CPC ....... C25B 1/04; C25B 11/051; C25B 11/091; C25B 11/093
See application file for complete search history.

(56) References Cited

U.S. PATENT DOCUMENTS

| | | |
|---|---|---|
| 9,115,434 B2 | 8/2015 | Lee et al. |
| 10,170,771 B2 | 1/2019 | Lewera et al. |
| 2010/0101955 A1* | 4/2010 | Nocera ............... C25B 11/073 204/547 |
| 2011/0048962 A1* | 3/2011 | Reece ............... H01M 4/90 205/639 |
| 2017/0073825 A1* | 3/2017 | Sugano ............... C25B 11/031 |
| 2017/0130348 A1* | 5/2017 | Mei ............... C25B 13/02 |
| 2018/0044804 A1 | 2/2018 | Hunter et al. |
| 2019/0085477 A1* | 3/2019 | Ono ............... C25B 1/00 |

(Continued)

FOREIGN PATENT DOCUMENTS

CN   107195917 A   9/2017

OTHER PUBLICATIONS

Cheng-Wei Lin, Qing Luo, Meng Lei, Lai-Sen Wang, Dong-Liang Peng, Formic Acid Oxidation Catalytic Properties of Pd Nanoclusters Prepared by Physical Vapor Deposition, 2016, Atlantis Press, Proceedings of the 4th 2016 International Conference on Material Science and Engineering (ICMSE 2016), 8-13 (Year: 2016).*

(Continued)

*Primary Examiner* — Alexander W Keeling
*Assistant Examiner* — Mofoluwaso S Jebutu
(74) *Attorney, Agent, or Firm* — Oblon, McClelland, Maier & Neustadt, L.L.P.

(57) ABSTRACT

An oxygen evolution reaction catalyst electrode may include: a glass electrode; a first coating, directly upon the glass electrode, comprising a layer of fluorine-doped tin oxide (FTO); and a second coating, directly upon the first coating, comprising a layer comprising at least 95 wt. % palladium, relative to a total weight of the second coating, wherein the palladium in the second coating is in the form of porous, spongy-textured clusters comprising palladium spheroid nanoparticles in cubic crystalline phase. The second coating may have a thickness in a range of from 0.5 to 10 μm, and the clusters may have an average largest dimension in a range of from 500 to nm.

13 Claims, 29 Drawing Sheets

(56) References Cited

U.S. PATENT DOCUMENTS

2019/0134609 A1* 5/2019 Yamauchi ............ B01J 35/0033

OTHER PUBLICATIONS

Heydari, H., Abdolmaleki, A., & Gholivand, M. B. (2015). Electrodeposition and characterization of palladium nanostructures on stainless steel and application as hydrogen sensor. Ciência E Natura, 37, 23-33. (Year: 2015).*

F. Sarto, E. Castagna, M. De Francesco, T.M. Dikonimos, L. Giorgi, S. Lecci, M. Sansovini, V. Violante, Morphology and electrochemical properties of Pd-based catalysts deposited by different thin-film techniques, International Journal of Hydrogen Energy, vol. 39, Issue 27, 2014, pp. 14701-14711. (Year: 2014).*

Jennifer Gonzales, Sponges and Spicules, 2016, SJSU—Geological Oceanography Lab, https://mlml.sjsu.edu/geooce/2016/09/28/sponges-and-spicules/ (Year: 2016).*

"Spongy". Oxford English Dictionary, https://www.lexico.com/en/definition/spongy. accessed 2022. (Year: 2022).*

F. Zhou, H. Li, M. Fournier, D. R. MacFarlane, Electrocatalytic $CO_2$ Reduction to Formate at Low Overpotentials on Electrodeposited Pd Films: Stabilized Performance by Suppression of CO Formation, ChemSusChem 2017, 10, 1509. (Year: 2017).*

Ehsan, et al. ; Single-Step Fabrication of Nanostructured Palladium Thin Films via Aerosol-Assisted Chemical Vapor Deposition (AACVD) for the Electrochemical Detection of Hydrazine ; Electrocatalysts ; Feb. 21, 2019 ; 9 Pages.

Ehsan, et al. ; Vysotskite structured photoactive palladium sulphide thin films from dithiocarbamate derivatives ; New Journal of Chemistry Issue 9 ; May 30, 2014 ; 23 Pages.

Joya, et al. ; Nanoscale Palladium as a New Benchmark Electrocatalyst for Water Oxidation at Low Overpotential ; Journal of Materials Chemistry A ; Mar. 12, 2019 ; Abstract Only ; 3 Pages.

Ehsan, et al. ; Fabrication of Nanostructured Pd Thin Films Using Aerosol-Assisted Chemical Vapor Deposition for the Nonenzymatic Electrochemical Detection of $H_2O_2$ ; Applied Electronic Materials ; Feb. 14, 2019 ; Abstract Only ; 2Pages.

Li, et al. ; A three-dimensional hexagonal fluorine-doped tin oxide nanocone array: a superior light harvesting electrode for high performance photoelectrochemical water splitting ; Energy & Environmental Science Issue 11 ; Jul. 15, 2014 ; Abstract Only ; 4 Pages.

Sarkar, et al. ; An overview on Pd-based electrocatalysts for the hydrogen evolution reaction ; Inorganic Chemistry Frontiers, Issue 9 ; May 30, 2018 ; Abstract Only ; 4 Pages.

* cited by examiner

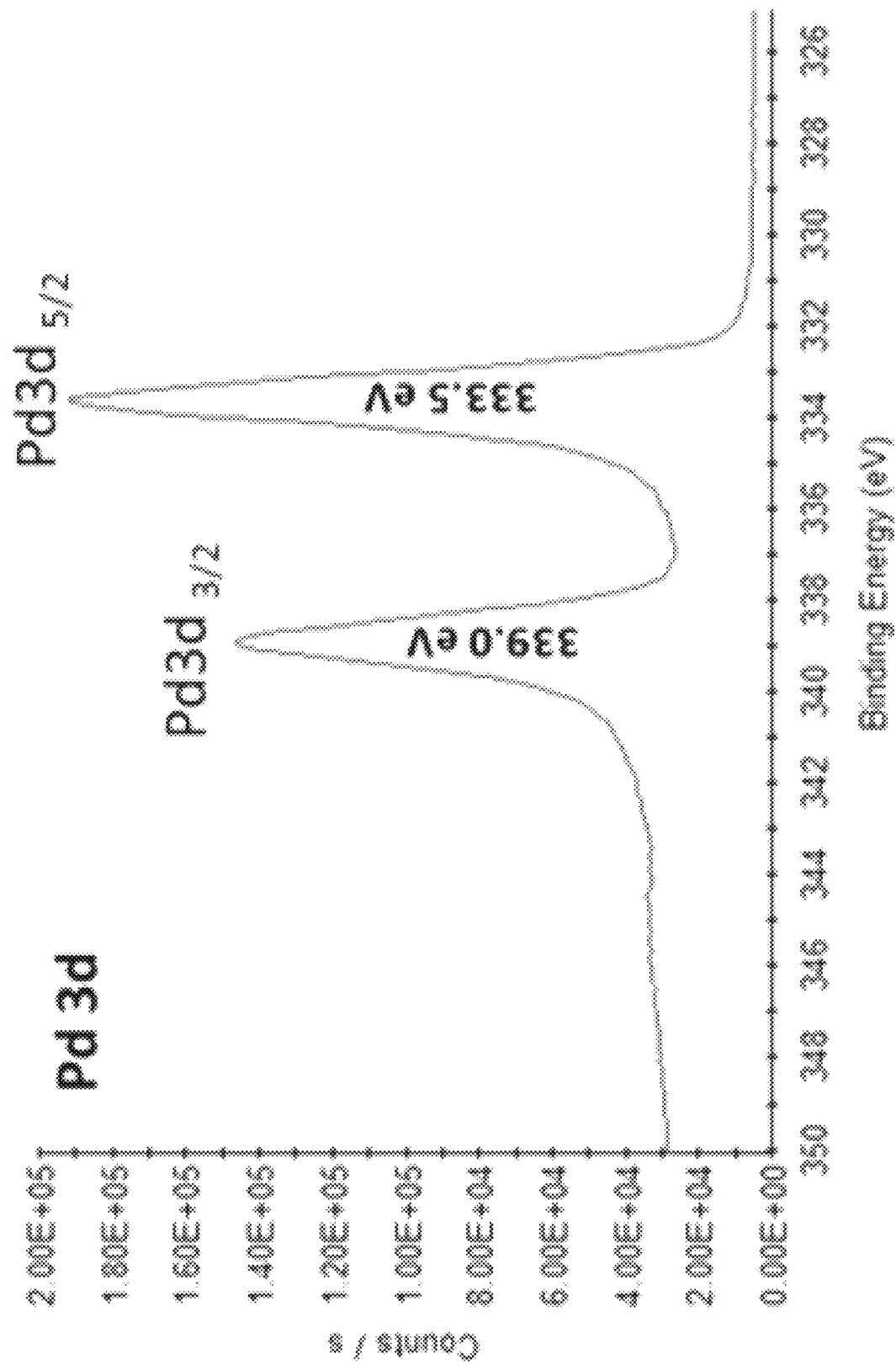

PD-COMPRISING ELECTROCATALYSTS SUITABLE FOR WATER SPLITTING

STATEMENT REGARDING PRIOR DISCLOSURES BY INVENTOR(S)

Aspects of the present disclosure are described in "Nanoscale Palladium as A New Benchmark Electrocatalyst for Water Oxidation at Low Overpotential," which published online in *J. Mater. Chem. A* 2019, 7, 9137-9144, DOI: 10.1039/C9TA01198F, on Mar. 12, 2019, which is incorporated herein by reference in its entirety.

BACKGROUND OF THE INVENTION

Field of the Invention

The present disclosure relates to electrocatalysts which may be useful in water splitting, particularly palladium-comprising electrocatalysts, as well as method of making and using such catalysts.

Description of the Related Art

Growing levels of $CO_2$ in the atmosphere are generally correlated with a greenhouse effect and global warming, which has initiated concerns both in political and scientific debates about $CO_2$ capture and transformation into storable fuels. A significant cause of $CO_2$ release into the atmosphere is conventional fossil fuel use in automobiles and power generation. Meanwhile, natural fuel assets, such as gas and crude oils, are being depleting rapidly due to consumption. Increasing demand for energy has focused research attention towards synthesizing and storing renewable energy sources, such as hydrogen-based fuels obtainable, e.g., from water splitting. Efficient and cost-effective water splitting would be a key technological advancement to pursuing a hydrogen-based energy economy. The protons and electrons evolved during water splitting can also be advantageously combined with $CO_2$ to reduce $CO_2$ to methanol, formic acid, and/or other useful products. Such a concept could provide solutions both to energy problems and environmental issues, while exploiting water and sunlight abundantly available on earth.

To make $H_2$ production more energy efficient, an effective catalytic system must be developed and implemented for water oxidation. Thus, for high production rates of fuels both half reactions of water splitting, i.e., oxidation and reduction, should proceed with optimum efficiency. However, the oxygen evolution reaction (OER) requires arduous overpotentials that make OER kinetically and thermodynamically unfavorable. Therefore, the overall OER electrocatalysis efficiency depends on the activity of the electrocatalyst mediating the oxygen evolution to generate $O_2$, electrons, and protons. Thus, developing catalytic materials which can facilitate multiple electron and proton transfers for water splitting over a narrow potential window would offer a tremendous advantage. Such catalysts could enable electrochemically-driven water oxidation schemes with molecular catalysts and oxide-based systems.

Water oxidation electrocatalysts operable at a lower overpotential, showing a high TOF value, and able to produce a stable current density of 10 to 100 $mA/cm^2$ with high stability under the vigorous oxidative conditions would be ideal for wide-scale industrial application. Furthermore, nano-textured morphologies with numerous open electroactive sites could aid electron transfer and facilitate mass transport during the catalytic reaction.

Efforts at developing such catalysts, systems, and/or methods are known in the art. For example, US 2018/0044804 A1 by Hunter et al. (Hunter) discloses processes and systems for hydrocarbon oxidation. Hunter's process involves contacting a water oxidation electrocatalyst with a hydrocarbon and water in the presence of a non-aqueous solvent, applying an anodic bias to the electrocatalyst to generate an oxidized hydrocarbon, wherein the electrocatalyst comprises a transition metal other than Ru. Water may be in Hunter's non-aqueous solvent at less than or equal to 0.5 vol. %. The anodic bias may be selected to generate an oxidized hydrocarbon in a tailored product distribution. Hunter's electrocatalyst may be a metal oxide or hydroxide of Ni, Fe, Co, Mn, Zn, Sc, V, Cr, Cu, Ti, or a lanthanide, but preferably excludes platinum group metals, i.e., Ru, Rh, Pd, Os, Ir, and Pt. Hunter may use a fluorine-doped tin oxide (FTO) glass substrate, but exemplifies only Ni—Fe catalysts and does not disclose a palladium layer of porous textured clusters comprising nano-spicules.

U.S. Pat. No. 9,115,434 to Lee et al. (Lee) discloses water a splitting oxygen evolving catalyst including: a metal oxide particle including a metal oxide, $Co_{1-x}M_xO_y$, wherein M is Al, In, Ga, Si, and/or Sn, $0 \leq x < 0.5$, and $1 < y < 2$, and the metal oxide particle is in the form of a flake. Lee's electrocatalyst contains neither palladium, nor has porous clusters comprising needles/spicules.

CN 107195917 A by Sun et al. (Sun) discloses Au—Pd "nano-forest" nano-wire electrocatalysts vertically grown on an FTO glass. Sun's Au—Pd electrocatalyst vertically grows on a conductive substrate by solution seeding, growing Au—Pd nanowires along a direction vertical to the substrate with a diameter up to 10 nm. Sun's electrocatalyst may be used in electrochemistry and fuel cells. However, Sun's electrocatalyst requires gold, and does not have a sponge-like spicule morphology, i.e., node-containing or interconnected star-like, or having (optionally interconnected) needles projecting outward three-dimensionally from central nodes. Sun's catalyst has a linear or at most spaghetti noodle-like morphology.

U.S. Pat. No. 10,170,771 to Lewera et al. (Lewera) discloses a catalyst comprising a layer of metallic palladium implanted with inert gas ions/atoms, an electrochemical system containing the catalyst, a palladium-inert gas alloy stable under normal conditions, a fuel cell containing the catalyst, and uses of these. Lewera's inert gas may be $N_2$, Ne, Ar, Kr, and/or Xe, and should be embedded in an atomic ratio of 10000:1 to 1:1. Lewera's substrate may be carbon, polymer, semiconductor, or metallic. Lewera does not disclose an FTO glass electrode coated with palladium layer, generally free of inert gas impregnation, having porous, textured clusters comprising spicules.

*Electrocatalysis* 2019, pp. 1-8 by Ehsan et al. (Ehsan I—incorporated herein by reference), published Feb. 21, 2019, discloses AACVD being successfully implemented to fabricate nanostructured Pd thin films on FTO substrates. The Pd films are produced using palladium acetylacetonate ($Pd(C_5H_7O_2)_2$) under $N_2$ flow without incorporating hydrogen gas or other reducing agents. Ehsan I's palladium nanostructured films were tested for sensing of $H_2NNH_2$. A stable and reproducible amperometric response for $H_2NNH_2$ oxidation was obtained. Ehsan's FTO glass substrate is heated 475° C. and treated with vapor of PA in solution using $N_2$ carrier gas at flow rate of 150 $cm^3$/minutes for only 30 minutes. For routine methods of film preparation, when the thickness in increased, the structure of the deposited films starts to deteriorate, which is not the case for AACVD. Ehsan I does not necessarily teach selecting AACVC, particularly for deposition periods of 40, 60, 90, 120, 180, or more minutes. Ehsan I fails to describe particular deposition times nor the application to producing $H_2$ from water.

*New J. Chem.* 2014, 38(9), 4083-4091 by Ehsan et al. (Ehsan II) discloses Pd (II) dithiocarbamate complexes of a general formula $Pd(S_2CNRR')_2].n(C_5H_5N)$ as single source precursors (SSPs) for developing PdS thin films. Ehsan II's PdS thin films were deposited on FTO conducting glass substrates at 400, 450, and 500° C. by AACVD to give a tetragonal structure with a 1 Pd: 1 S ratio. Ehsan II describes that the shape and size of PdS crystallites and the texture of films depend on the deposition temperatures and the precursor. Ehsan II studies the photoelectrochemical (PEC) properties of PdS films by current-voltage plots under alternating dark and illumination conditions, but requires a sulfided material and does not describe unsulfided PD catalysts with spicule structures, nor OER applications.

*J. Mater. Chem. A* 2019, 7, 9137-9144 by Joya et al. (Joya—incorporated herein by reference) discloses catalytic materials for efficient water oxidation at overpotentials below 1.50 V vs. RHE, exhibiting stability with high oxygen evolution reaction (OER) current density over a small potential window. Joya's nanoscale nanoporous Pd electrocatalyst for water oxidation executes water oxidation at an onset potential of just 1.43 V vs. RHE ($\eta$ of 200 mV), reaching a current density of 10 mA/$cm^2$ at 1.47 V ($\eta$=240 mV), with a current density of 100 mA/$cm^2$ at 1.63 V ($\eta$ of 400 mV). Joya's catalyst demonstrates a Tafel slope of 40 mV/dec, a high mass activity of 560 mA/mg, a TOF value of 0.2 Hz, and is stable. Joya's Pd electrocatalyst was obtained via AACVD on conducting surfaces, having a highly porous nanostructure, for water oxidation and for chemical energy conversion.

*ACS Appl. Electron. Mater.* 2019, 1(3), 417-429 by Ehsan et al. (Ehsan III—incorporated herein by reference) discloses an AACVD-produced Pd film on indium tin oxide (PdNP-ITO) for electrochemical detection of $H_2O_2$. Ehsan III's electrodes were used for nonenzymatic amperometric $H_2O_2$ detection via electrochemical reduction with an LOD was 40.8 nM and a sensitivity of 760.84 μA/(μM $cm^2$). Ehsan III does not describe OER applications, nor particular morphologies of its catalyst.

*Energy Environ. Sci.* 2014, 7, 3651-3658 by Li et al. (Li) discloses photonic nanostructures for light harvesting as a 3D hexagonal nanocone array of fluorine-doped tin oxide (FTO) on glass as an electrode for photoelectrochemical (PEC) water splitting. Li discloses increasing a Ti-doped hematite at 1.23 V vs. RHE by 86% to 2.24±0.02 mA/$cm^2$ compared to its planar counterpart. Li describes embedding a gold layer to concentrate the incident light onto the hematite layer and depositing modified Co-Pi catalyst. Li does not disclose an FTO conducting glass electrode coated with a porous palladium layer, particularly without a sponge-spicule-like structure.

*Inorg. Chem. Front.* 2018, 5, 2060-2080 by Sarkar et al. (Sarkar) discloses Pd substitution of Pt for the hydrogen evolution reaction (HER) in the form of nanoparticles, alloys, bimetallics, and intermetallics. Sarkar does not disclose an FTO glass electrode coated with a Pd layer having porous textured clusters comprising nano-spicules.

In light of the above, a need remains for electrocatalysts, particularly for OER, and particularly containing Pd and/or having porous, star-like morphologies (sponge-spicule structure), and methods of making and using such catalysts.

SUMMARY OF THE INVENTION

Aspects of the invention provide oxygen evolution reaction catalysts, comprising: a glass electrode a first coating, directly upon the glass electrode, comprising a layer of fluorine-doped tin oxide (FTO); and a second coating, directly upon the first coating, comprising a layer comprising at least 95 wt. % palladium, relative to a total weight of the second coating, wherein the palladium in the second layer forms porous, spongy-textured clusters comprising palladium spheroid nanoparticles in cubic crystalline phase. Such catalysts may be modified with any permutation of the features described herein, particularly the following.

The second coating may have a thickness in a range of from 0.5 to 10 μm.

Inventive catalysts may have an XRD pattern with a (111) plane peak, in a range of from 39 to 41°, and a (200) plane peak, in a range of from 46 to 48°, wherein the (111) plane peak relative to the (200) plane peak has a height ratio in a range of from 3:1 to 1.5:1.

Inventive catalysts may have an XRD pattern comprising only: a first 2θ peak in a range of from 39 to 41°; a second 2θ peak in a range of from 46 to 48°; a third 2θ peak in a range of from 67 to 69°; a fourth 2θ peak in a range of from 81 to 83°; and a fifth 2θ peak in a range of from 86 to 88°.

Inventive catalysts may comprise no more than 2.5 wt. % palladium oxide, relative to all palladium present in the catalyst.

The second coatings may consist essentially of Pd.

Inventive catalysts may comprise no further coatings than the first and second coatings.

Inventive catalysts may have an electroactive surface area in a range of from 15 to 30 $cm^2$, an OER overpotential of no more than 225 mV at 1.43 V against a reversible hydrogen electrode, and/or a mass activity in a range of from 500 to 750 mA/mg.

The clusters may have an average largest dimension above 500 nm.

Inventive catalysts may comprise no Ru and/or no active catalytic metals besides Pd.

Aspects of the invention include electrochemical cells, comprising any inventive catalyst(s) described herein as a working electrode.

Aspects of the invention comprise methods of conducting the oxygen evolution reaction, comprising contacting water with any inventive catalyst(s) described herein.

Aspects of the invention provide methods of making a Pd-coated electrode, which methods may comprise: heating a glass electrode coated with a layer of fluorine doped tin oxide (FTO) to a temperature in the range of 300 to 600° C.; and depositing, by aerosol-assisted chemical vapor deposition, onto the glass electrode a layer of a porous palladium from an aerosol of a solution comprising a palladium complex and/or salt, with an inert gas carrier for a deposition time in a range of from 35 to 300 minutes, while heating at a temperature in a range of from 300 to 600° C.

Inventive methods may further comprising, after the depositing: allowing the electrode to cool in an inert atmosphere to ambient temperature.

The depositing may be conducted at at least 425° C., and/or may take place for at least 120 minutes.

The palladium complex and/or salt may comprise palladium(II) acetylacetonate, tetrakis(triphenylphosphine) palladium(0), bis(triphenylphosphine) palladium(II) dichloride, bis(triphenylphosphine) palladium(II) diacetate, bis(dibenzylideneacetone) palladium(0), (ethylenediamine) palladium(II) halide (esp. chloride), palladium(II) iodide, palladium (II) chloride, palladium(II) bromide, palladium(II) acetate, palladium(II) trifluoroacetate, palladium(II) nitrate, palladium(II) pivalate, bis(benzonitrile) palladium(II) halide (esp. chloride), palladium (π-cinnamyl) halide (esp. chloride) dimer, tetrakis(acetonitrile) palladium(II) tetrafluoroborate, palladium(II) hexafluoroacetylacetonate, palladium(II) sulfate, palladium(II) cyanide, palladium(II) propionate, (2-methylallyl) palladium(II) halide (esp. chloride) dimer, bis(tri-tert-butyl-phosphine) palladium(0), dichloro-bis-(tricyclohexylphosphine) palladium(II), (1,3-bis-(diphenylphosphino)propane) palladium(II) halide (esp. chloride), and/or dichloro(1,10-phenanthroline) palladium (II).

The depositing may comprise combusting or otherwise eliminating as exhaust gas at least 97.5 wt. % of any organic residues of the palladium complex and/or salt.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2B shows a high resolution XPS spectrum for $Pd_{180}$ showing binding energies for the $Pd^0$ (elemental) state;

DETAILED DESCRIPTION OF THE PREFERRED EMBODIMENTS

Figure 1A:
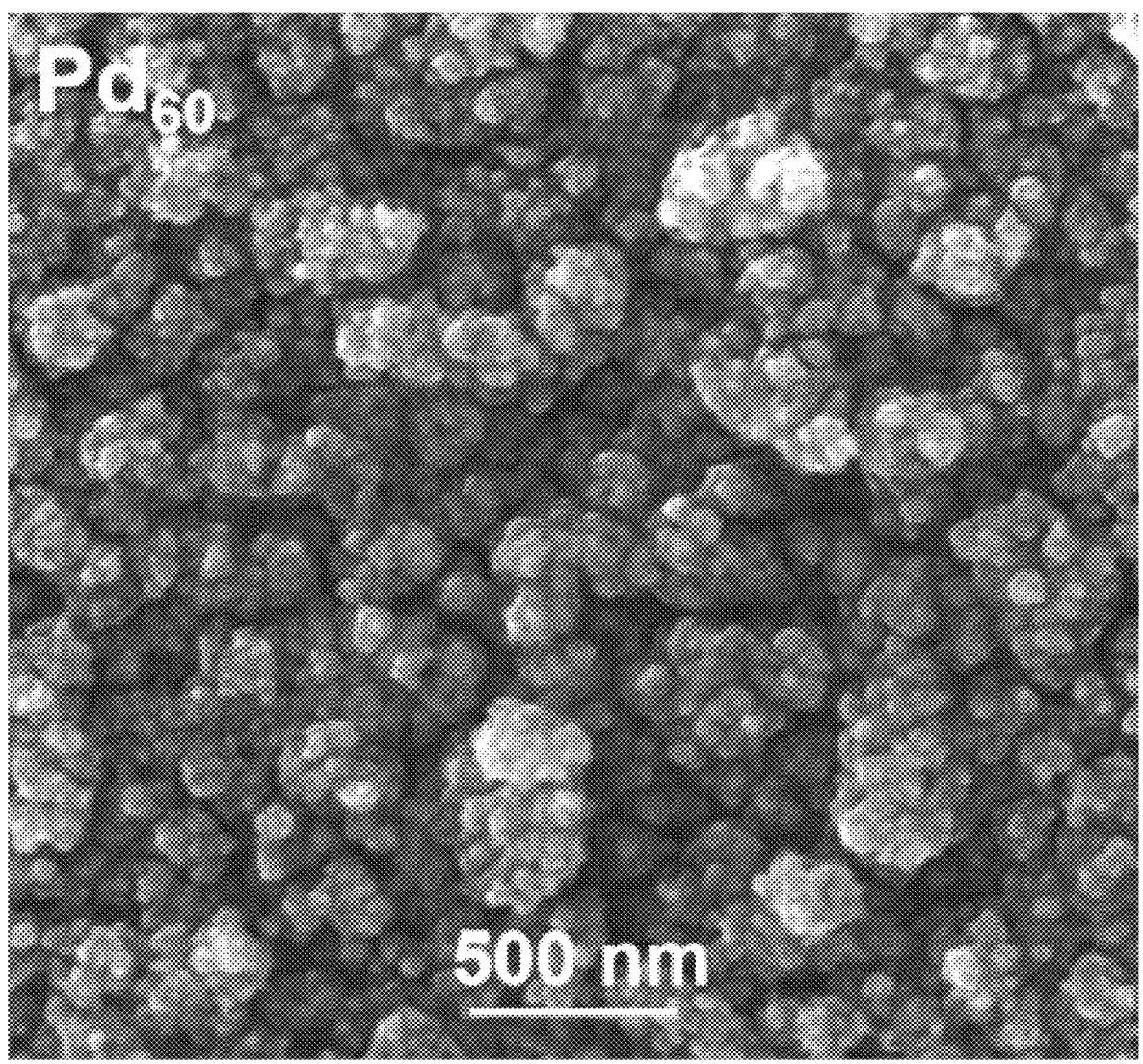
FIG. 1A shows a scanning electron microscopy (SEM) image for an exemplary palladium film electrode, $Pd_{60}$, deposited for 60 minutes on a fluorine-doped tin oxide (FTO) glass substrate at 475° C. from palladium acetylacetonate via Aerosol-Assisted Chemical Vapor Deposition (AACVD)

Aspects of the invention provide oxygen evolution reaction catalysts, comprising: a glass electrode a first coating, directly upon the glass electrode, comprising a layer of fluorine-doped tin oxide (FTO); and a second coating, directly upon the first coating, comprising a layer comprising at least 95, 96, 97, 97.5, 98, 99, 99.1, 99.5, 99.9, or 99.99 wt. % palladium, relative to a total weight of the second coating, wherein the palladium in the second layer forms porous, spongy-textured clusters comprising palladium spheroid nanoparticles in cubic crystalline phase, i.e., at least 75, 80, 85, 90, 92.5, 95, 97.5, 98, 99, 99.1, 99.5, or 99.9% of the Pd in cubic crystalline form. The morphology of the deposited palladium may take on a cauliflower-like appearance with thinner, lower deposition duration layers, and grow into a crumbly blue cheese-like appearance, with frazzled tips/edges, particularly with layers of over 3 μm corresponding to deposition times as described herein of over 120, 150, or 180 minutes (at 475° C. and 150 mL/minute carrier gas flow). The temperature and flow rate may be adjusted appropriately to match reactor conditions, e.g., at least 425, 435, 445, 455, 460, 465, 470, 475, 480, 485, 490, or 495° C. and/or no more than 600, 590, 580, 570, 560, 550, 540, or 530° C., and/or at least 125, 130, 135, 140, 145, 150, 155, 160, 165, 170, 175, or 180 mL/minute and/or up to 1000, 750, 625, 500, 450, 400, 375, 350, 325, 300, 275, 250, 225, or 200 mL/minute on laboratory scale. Of course, these flow rates could be amplified by orders of magnitude, e.g., $10^1$, $10^2$, $10^3$, $10^4$, $10^5$ or more, when conducted on pilot or plant scale. The morphology of inventive Pd layers generally does not appear rod-like or nano-wire-like, nor spaghetti-like under SEM analysis, but instead may have interconnected, cross-sectionally irregular shaped binders appearing like dense neurons and synapses. Outer volumes of inventive palladium layers may have a fractal appearance.

The second coating, i.e., containing the Pd, may have a thickness in a range of from 0.5 to 10 μm, e.g., at least 0.6, 0.75, 0.85, 1, 1.25, 1.5, 1.75, 2, 2.25, 2.5, 2.75, 3, 3.25, 3.5, 3.75, 4, 4.25, 4.5, 4.75, or 5 μm and/or up to 9.5, 9, 8.5, 8, 7.5, 7.25, 7, 6.75, 6.5, 6.25, or 6 μm.

Inventive catalysts may have an XRD pattern with a (111) plane peak, in a range of from 39 to 41°, and a (200) plane peak, in a range of from 46 to 48°, wherein the (111) plane peak relative to the (200) plane peak has a height ratio in a range of from 3:1 to 1.5:1, e.g., at least 1.6:1, 1.75:1, 1.8:1, 1.85:1, 1.9:1, 1.95:1, or 2:1.

Inventive catalysts may have an XRD pattern comprising only: a first 2θ peak in a range of from 39 to 41°; a second 2θ peak in a range of from 46 to 48°; a third 2θ peak in a range of from 67 to 69°; a fourth 2θ peak in a range of from 81 to 83°; and a fifth 2θ peak in a range of from 86 to 88°. That is these five XRD peaks may be the only non-noise signals in the XRD pattern, particularly with the first peak being the most prominent by a factor of at least 1.5, 1.75, 2, or more over the second most prominent peak, which is the second peak, whereby the third and fourth peaks may be less than 0.25, 0.2, or 0.15-fold the major peak, and are within 25% of each other in height.

Inventive catalysts may comprise no more than 2.5, 2, 1, 0.1, 0.01, 0.001, or 0.0001 wt. % palladium oxide, relative to all palladium present in the catalyst. The second coatings may consist essentially of Pd, i.e., contain no other metals and/or materials which shift the overpotential by more than 25% from the catalyst without such metals/materials. Inventive catalysts may comprise no further coatings than the first and second coatings. That is, the catalyst electrodes may have only the FTO layer and the palladium layer, with no further coatings or electronic layers. Inventive catalysts may comprise no Ru, no Au, no Pt, and/or no active catalytic metals besides Pd.

Inventive catalysts may have an electroactive surface area in a range of from 15 to 30 $cm^2$, e.g., at least 16, 17, 18, 19, 20, or 21 $cm^2$ and/or no more than 29, 28, 27, 26, 25, 24, 23, 22, 21, or 20 $cm^2$. Inventive catalysts may have an OER overpotential of no more than 225 mV at 1.43 V against a reversible hydrogen electrode, e.g., no more than 220, 215, 210, 205, 200, 195, 190, 185, 180, or 175 mV. Inventive catalysts may have a mass activity in a range of from 500 to 750 mA/mg, e.g., at least 505, 510, 515, 520, 525, 530, 535, 540, 545, 550, 555, 560, 565, 570, or 575 mA/mg and/or no more than 725, 700, 675, 650, 640, 630, 625, 620, 610, 600, or 590 mA/mg.

The clusters may have an average largest dimension above 500, 750, 850, 900, 1000, 1100, 1250, 1500, 1750, 2000, 2500, or 3000 nm and/or up to 10, 9, 8, 7, 6, 5, 4, 3.5, 3, 2.5, 2, 1.5, or 1 μm.

Aspects of the invention provide methods of making a Pd-coated electrode, which methods may comprise: heating a glass electrode coated with a layer of fluorine doped tin oxide (FTO) to a temperature in the range of 300 to 600° C., e.g., at least 325, 350, 375, 400, 425, 450, or 475° C. and/or no more than 585, 575, 565, 550, 540, 530, 520, 510, 500, or 490° C.; and depositing, by aerosol-assisted chemical vapor deposition, onto the glass electrode a layer of a porous palladium from an aerosol of a solution comprising a palladium complex and/or salt, with an inert gas carrier for a deposition time in a range of from 35 to 300 minutes, e.g., at least 40, 50, 60, 70, 80, 90, 100, 110, 120, 130, 140, 150, 160, 170, 180, 190, or 200 minutes and/or no more than 290, 280, 270, 260, 250, 240, 235, 230, 225, 220, 215, 210, 205, or 200 minutes, while heating at a temperature in a range of from 300 to 600° C., e.g., any of the above temperatures, and/or at least 380, 395, 410, 420, 430, 440, 455, 465, 470, or 480° C. and/or no more than 580, 570, 560, 545, 535, 525, 515, 505, 495, or 485° C. (any of which of these temperatures may also serve as a endpoints in the heating).

Inventive methods may further comprising, after the depositing: allowing the electrode to cool in an inert (such as Ar, $N_2$, He, or the like) or substantially inert (i.e., with $N_2$ enriched air, such as 85, 87.5, 90, 92.5, 95, or 97.5% $N_2$) atmosphere to ambient temperature.

The depositing may be conducted at a temperature of at least 425, 430, 435, 440, 445, 450, 455, 460, 465, 470, 475, 480, 485, or 490° C. The depositing may take place for at least 120, 125, 130, 135, 140, 145, 150, 155, 160, 165, 170, 175, 180, 185, or 190 minutes and/or up to 240, 230, 220, 210, 205, 200, or 195 minutes.

The palladium complex and/or salt may comprise, merely as examples, palladium(II) acetylacetonate, tetrakis(triphenylphosphine) palladium(0), bis(triphenylphosphine) palladium(II) dichloride, bis(triphenylphosphine) palladium(II) diacetate, bis(dibenzylideneacetone) palladium(0), (ethylenediamine) palladium(II) halide (esp. chloride), palladium (II) iodide, palladium(II) chloride, palladium(II) bromide, palladium(II) acetate, palladium(II) trifluoroacetate, palladium(II) nitrate, palladium(II) pivalate, bis(benzonitrile) palladium(II) halide (esp. chloride), palladium (π-cinnamyl) halide (esp. chloride) dimer, tetrakis(acetonitrile) palladium (II) tetrafluoroborate, palladium(II) hexafluoroacetylacetonate, palladium(II) sulfate, palladium(II) cyanide, palladium (II) propionate, (2-methylallyl) palladium(II) halide (esp. chloride) dimer, bis(tri-tert-butyl-phosphine) palladium(0), dichloro-bis-(tricyclohexylphosphine) palladium(II), (1,3-bis-(diphenylphosphino)propane) palladium(II) halide (esp. chloride), and/or dichloro(1,10-phenanthroline) palladium (II), particularly palladium complexes having chelating moieties comprising only C, H, and/or O, such as Pd(acac)$_2$, palladium oxalate, palladium acetate, palladium formate, palladium 2,4-pentanedionate. The solution or suspension of the palladium complex(es) and/or salt(s) may contain only one palladium compound for simplicity, but may comprise mixtures of 2, 3, 4, 5, 6, or more compounds.

The depositing may comprise combusting or otherwise eliminating as exhaust gas at least 97.5, 98, 98.5, 99, 99.5, 99.9 wt. %, or all detectable amounts, of any organic residues of the palladium complex and/or salt.

Inventive catalysts may exclude, contain no more than detectable amounts, or may comprise no more than 15, 10, 7.5, 5, 4, 3, 2, 1, 0.5, 0.1, or 0.01 wt. %, relative to the total metal weight in the catalysts, of Ni, Fe, Co, Mn, Zn, Sc, V, Cr, Cu, Ti, La, Ce, Pr, Nd, Pm, Sm, Eu, Gd, Tb, Dy, Ho, Er, Tm, Yb, and/or Lu, either individually, in combination(s), or in total, and considered either as active catalytic metals or as total metals. Inventive catalysts may particularly exclude Co, or contain no more than traces of Co, or less than 5, 2.5, 1, 0.5, 0.1, 0.01, 0.001, or 0.001 wt. % of Co, relative to all metals or all active catalytic metals in the catalyst. Inventive catalysts may likewise contain no more than traces or less than 5, 2.5, 1, 0.5, 0.1, 0.01, 0.001, or 0.001 wt. % of Al, In, Ga, Si, and/or Sn, relative to all metals or all active catalytic metals in the catalyst. Inventive catalysts may exclude combinations of Co with Al, In, Ga, Si, and/or Sn. Inventive catalysts may exclude, contain only traces of, or contain no less than 10, 5, 2.5, 1, 0.5, 0.1, 0.05, 0.01, 0.005, or 0.001 wt. % Au, relative to all metals in the catalyst, particularly relative to all active metals in the catalyst.

Substrates useful in the inventive catalysts need not be surface-treated, and may exclude, contain only traces of, or no more than 5, 2.5, 1, 0.5, 0.1, 0.01, 0.001, or 0.001 wt. % of (i) siloxanes, such as amino-siloxanes or particularly 3-aminopropyltriethoxysilane, (ii) mercaptans, such as 4-mercaptobenzoic acid, mercaptoacetic acid, or both, and/or (iii) organic polymers, such as poly(vinyl aromatic(s)), particularly polyvinylpyrrolidine, on the surface of the substrate, relative to other non-metallic components on the substrate surface. Inventive catalysts may exclude, contain only traces on instrumentational detection limits of, or no more than 2.5, 1, 0.5, 0.1, 0.01, 0.001, or 0.0001 wt. % of S, relative to other non-metallic components on the substrate surface.

Inventive catalysts may exclude, contain only traces on instrumentational detection limits of, or no more than 0.5, 0.1, 0.01, 0.001, 0.0001, 0.00001, 0.000001, or 0.0000001 atom % of N, Ne, Ar, Kr, and/or Xe atoms and/or ions, relative to the active catalytic metal, esp. Pd, either individually, in combination, or in total.

The electrode may include a fluorinated tin oxide (FTO) glass, an indium tin oxide (ITO), or a metal. The counter electrode may include Pt, Ni, C, and/or Fe.

Aspects of the invention provide nanoporous Pd-derived highly stable nanoscale materials for water oxidation catalysis including OER at a surprisingly low overpotential. Such materials may be deposited on, e.g., fluoride-doped tin oxide (FTO) glass substrates via Aerosol-Assisted Chemical Vapor Deposition (AACVD) from a solution or suspension comprising palladium, such as transparent yellow precursor solution of palladium acetylacetone Pd(acac)$_2$ in toluene, at varied deposition times. Five exemplary palladium thin-film electrodes $Pd_{40}$, $Pd_{60}$, $Pd_{90}$, $Pd_{120}$, and $Pd_{180}$ were prepared, as described below, at 475° C. on FTO substrates using a palladium acetylacetonate solution via AACVD for 40, 60, 90, 120 and 180 minutes of deposition, under inert gas, such as $N_2$, Ar, He, or the like.

Aspects of the invention provide efficient electrocatalytic Pd systems, preferably prepared via AACVD using simple organometallic precursor including Pd salt and/or Pd complexes, such as Pd(acac)$_2$, which may be deposited for different deposition times to achieve, e.g., different thicknesses and/or Pd-film morphologies. Increasing the deposition time has been surprisingly shown to produce ultrafine, highly porous thin films, having high electroactive site concentration during water oxidation catalysis. An exemplary $Pd_{180}$ catalytic film has shown remarkably low overpotential, η, of 200 mV (1.43 V vs. RHE) for OER, and overpotentials down to 225, 215, 210, 205, 202.5, 200, 197.5, 195, 192.5, 190, 185, 180, or 175 mV may be achieved. Moreover, inventive catalysts may have electroactive surface areas (ECSA) of 18, 19, 19.5, 20, 20.5, 21, 22, 23, 24 or more cm$^2$, mass activities (MA) of 525, 533.3, 540, 550, 555, 560, 565, 570, 575 or more mA/mg, and/or TOF values 0.175, 0.185, 0.19, 0.195, 0.2, 0.205, 0.21, 0.2175, 0.25 or more Hz, alongside stability during long-term continuous water electrolysis. Aspects of the invention apply such Pd systems as benchmark materials for water oxidation electrocatalysis, even on industrial scale.

CHEMICALS AND REAGENTS: All the chemicals and reagents were of analytical grade, obtained from Aldrich and were used as received without any purification unless otherwise noted. Palladium acetylacetone Pd(acac)$_2$ (99.9%) was obtained from Sigma Aldrich, Toluene (99.99%) from Sigma Aldrich, KOH (99.99%) from Sigma Aldrich. FTO coated glass substrates are obtained from Dyesol with a resistance value of approx. 15'Ω/sq.

Examples

Figure 5:
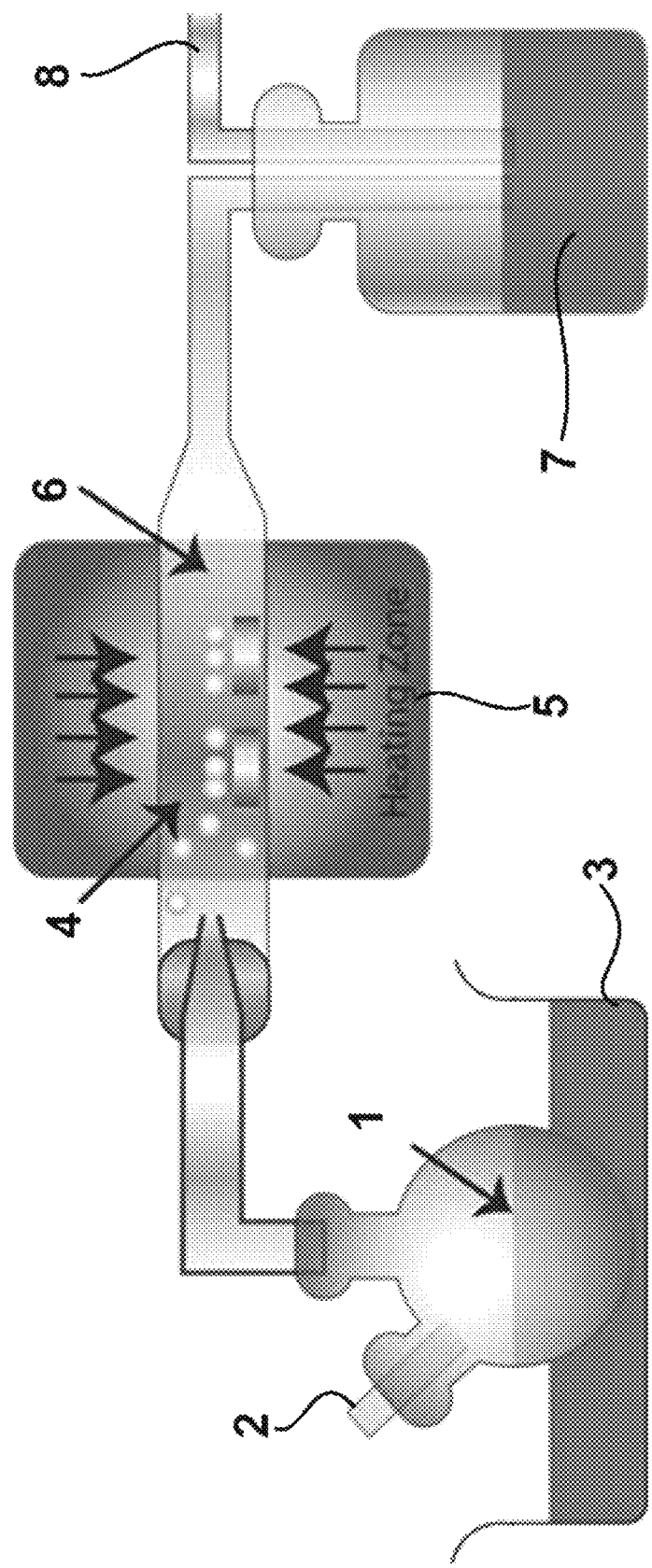
FIG. 5 shows a schematic illustration of an exemplary AACVD setup useful for synthesizing palladium depositions/layers/films according to the invention.

Palladium thin film electrodes were produced via AACVD (Aerosol-Assisted Chemical Vapor Deposition) on FTO glass substrates using organometallic palladium acetylacetone Pd(acac)$_2$ in toluene at 475° C. under a stream of nitrogen ($N_2$) gas at a rate of 150 cm$^3$/minute. The design and assembly of an exemplary AACVD setup, which was used in the Examples, is shown in FIG. 5. Precursor solutions were prepared by dissolving 200 mg of palladium acetylacetone Pd(acac)$_2$ (0.64 mmol) in 20 mL toluene. The resulting transparent yellow solution was used for growth of palladium thin films by AACVD. Prior to deposition, conducting glass substrates (FTO and plain glass) of dimensions 1.0×2.5 cm$^2$ (W×L) were cleaned with soapy water, acetone, and isopropanol, followed by water, then dried in an oven at 90° C. In each deposition experiment, the substrate was aligned horizontally inside the reactor tube, pre-heated up to the deposition temperature (475° C.), kept there for 10 minutes to equilibrate the temperature, and then the deposition process was started. The aerosol mist from $Pd(acac)_2$ in toluene solution was generated using piezoelectric ultrasonic humidifier, and the resulting aerosol was carried into the reactor tube by a stream of $N_2$ gas at a rate of 150 $cm^3$/min. The deposition was continued for desired time period, i.e., 40 to 180 minutes. The waste exhaust of the precursor mist was vented into a fume hood. After deposition, the films were allowed to cool under a continuous flow of $N_2$ gas to room temperature. The resulting film electrodes were uniform, shiny, greyish in color, and stable in air. The adhesion of the palladium films was analyzed by the "Scotch tape test" and layers were determined to be strongly intact with the FTO substrates. Multiple films of all samples were synthesized to determine the reproducibly of the process.

PALLADIUM FILM CHARACTERIZATION: X-ray diffraction (XRD) patterns of palladium film were recorded using Rigaku MiniFlex X-ray diffractometer (Japan) with Cu Kα1 radiation (γ=0.15416 nm), a tube current of 10 mA, and an accelerating voltage of 30 kV. Scanning electron microscope (SEM) images of the film electrodes were analyzed by a field emission scanning electron microscope (FE-SEM, Lyra3, Tescan, Czech Republic) at an accelerating voltage of 20 kV. The elemental stoichiometry and composition of film electrodes were investigated by Energy Dispersive X-ray (EDX, INCA Energy 200, Oxford Inst.) spectroscopy. X-ray photoelectron spectroscopy (XPS) experiments were performed in a Thermo Scientific Escalab 250Xi spectrometer equipped with a monochromatic Al Kα (1486.6 eV) x-ray source, having a resolution of 0.5 eV. During the XPS characterization, the ambient conditions of temperature were maintained while the pressure is controlled at $5 \times 10^{-10}$ mbar. The spectra were referenced with adventitious C is peak at 284.5 eV.

ELECTROCHEMICAL CHARACTERIZATION: All the electrochemical measurements were performed on a computer-controlled AOTULAB instrument potentiostat electrochemical work station employing FTO electrode coated with Pd-derived catalytic film as working electrode. Spiral-shaped Pt wire of 0.25 mm thickness was used as a counter electrode and saturated silver-silver chloride (Ag/AgCl in saturated solution of KCl) as reference electrode. For long-term electrocatalysis, a saturated calomel electrode (Hg/HgO) reference electrode was employed in 0.1 M KOH solutions. However, all the potentials refer to a reversible hydrogen electrode (RHE) following the Nernst equation, set forth below in Equation 1.

$$E_{RHE}=E_{REF}+E0_{REF}+0.059(PH) \qquad \text{Eq. 1}$$

Prior to use, the FTO glass slides were cleaned by sonicating in methanol, ultrapure water, then in acetone for 15 minutes in each, and finally dried in an oven at about 80° C. for 30 minutes. Before placement into an electrochemical cell, the platinum wire was cleaned by immersing it in a 20% solution of $HNO_3$ for few minutes following washing with MilliQ water. All the glassware and electrochemical cells were cleaned by boiling in a 1:3 mixture of $H_2SO_4$ and $HNO_3$ followed by boiling in water, then carefully rinsed with acetone, and dried by keeping in over at 100° C. for 1 hour, as described in *ACS Catalysis* 2014, 5, 627-630, which is incorporated by reference in its entirety herein. Electrochemical investigations such as cyclic voltammetry, electrochemical impedance spectroscopy (EIS), and controlled-potential bulk electrolysis experiments were performed in 0.1 M KOH electrolyte solutions having pHs around 13. Water used in all solutions in the electrochemical studies was distilled and deionized using the Milli-Q® system from Millipore.

ELECTROCHEMICAL IMPEDANCE SPECTROSCOPY: EIS analysis was carried out to gain insight into the electrochemical kinetics for the exemplary electrocatalysts produced as described herein. Data was recorded at an applied potential of 1.49 V against a reversible hydrogen electrode (RHE), considering the faradaic region of the cyclic voltammogram to investigate charge transfer resistance at the so-called electrode-electrolyte double layer.

MASS ACTIVITY: The loading normalized current density or mass activity (MA in mA/mg) was calculated according to the formula in Equation 2, below:

$$MA = \frac{J@\eta = 0.35 \text{ V}}{\text{Active mass of catalyst}}, \qquad \text{Eq. 2}$$

wherein J is current density in mA/$cm^2$ at specific potential value. The potential 1.58 V vs. RHE was chosen as specific potential value as guided by *Chem. Select* 2018, 3, 11357-11366, which is incorporated by reference herein in its entirety.

TURN OVER FREQUENCY (TOF) [HZ]: TOF is calculated using Equation 3, below:

$$TOF = \frac{J \times A}{4 \times F \times n}, \qquad \text{Eq. 3}$$

wherein, J is current density in A/$cm^2$ at 1.58 V vs. RHE, A is a geometrical area of the working electrode material ($cm^2$), F is the Faraday constant in C/mole, and n is number of moles of catalyst deposited on the electrode.

ELECTROCHEMICALLY ACTIVE SURFACE AREA: The electrochemically active surface area (ECSA, in $cm^2$) was calculated using a cyclic voltammetry (CV) mode by calculating double layer capacitance employing the formula in Equation 4, below:

$$ECSA = \frac{C_{DL}}{C_S}, \qquad \text{Eq. 4}$$

wherein $C_{DL}$ is double layer capacitance and $C_S$ is the specific capacitance. The non-faradaic region, somewhere between the oxygen and hydrogen region, in CV can be identified by visual analysis of cyclic voltammetry data assuming that all the current in this potential range is due to the double layer charging. Under this potential range, the CV was run at different scan rate (5 mV/s, 10 mV/s, 20 mV/s, 50 mV/s). The charging current ($I_c$) was calculated by identifying a middle potential range, which was 0.955 V vs. RHE, and the current associated with this potential range was considered as capacitive current or charging current. A plot of scan rate versus capacitive current was constructed and slope of this calibration curve gave the double layer capacitance values. Dividing $C_{DL}$ by $C_S$ of sample, $C_S$ being 0.043 mF/$cm^2$ in alkaline electrolyte solution for metal electrodes, gave the ECSA values.

Referring now to the drawings, wherein like reference numerals designate identical or corresponding parts throughout the several views.

Figure 1B:
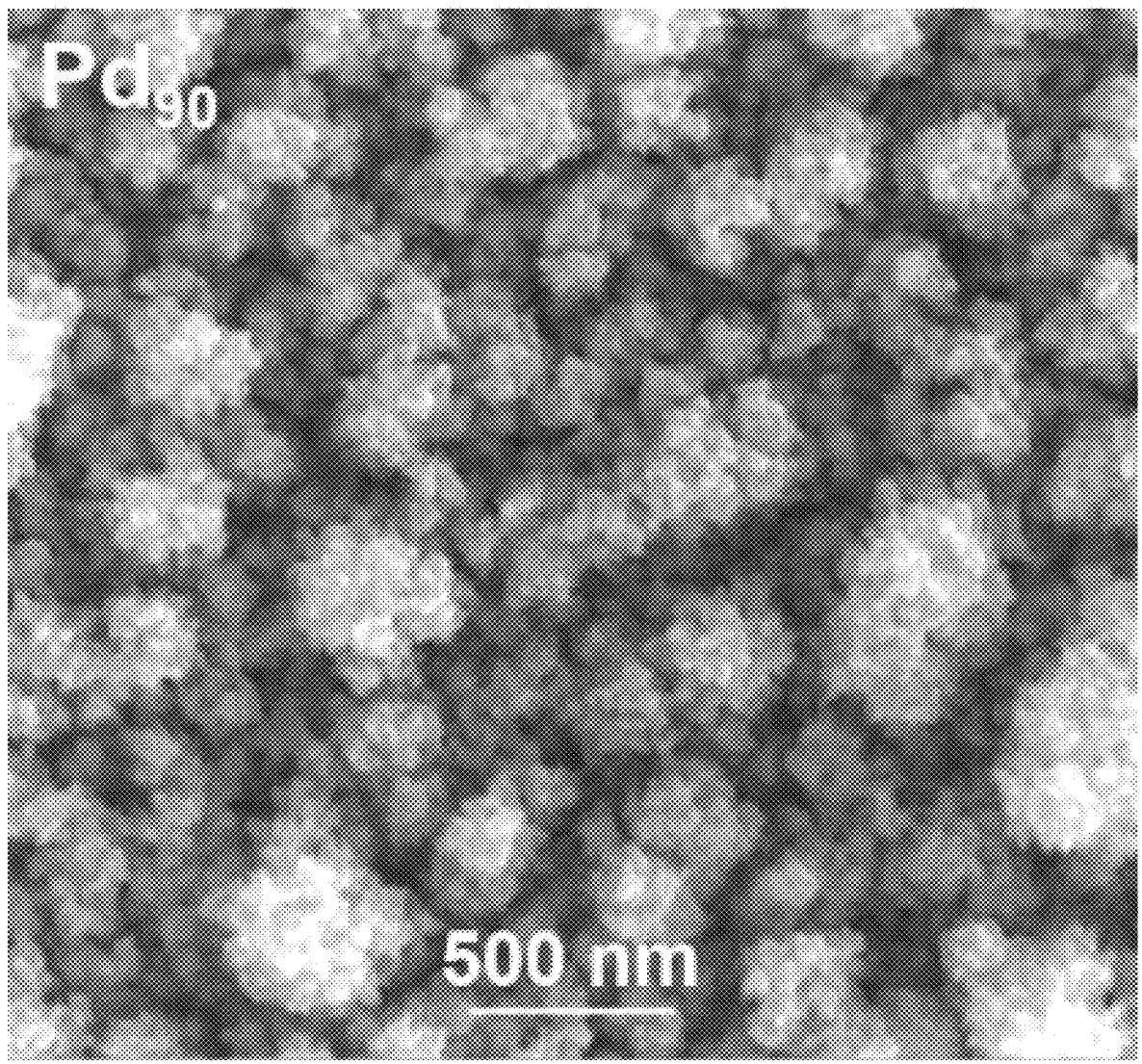
FIG. 1B shows an SEM image for an exemplary palladium film electrode, $Pd_{90}$, deposited for 90 minutes of deposition time on an FTO glass substrate at 475° C. from palladium acetylacetonate via AACVD.
Figure 1C:
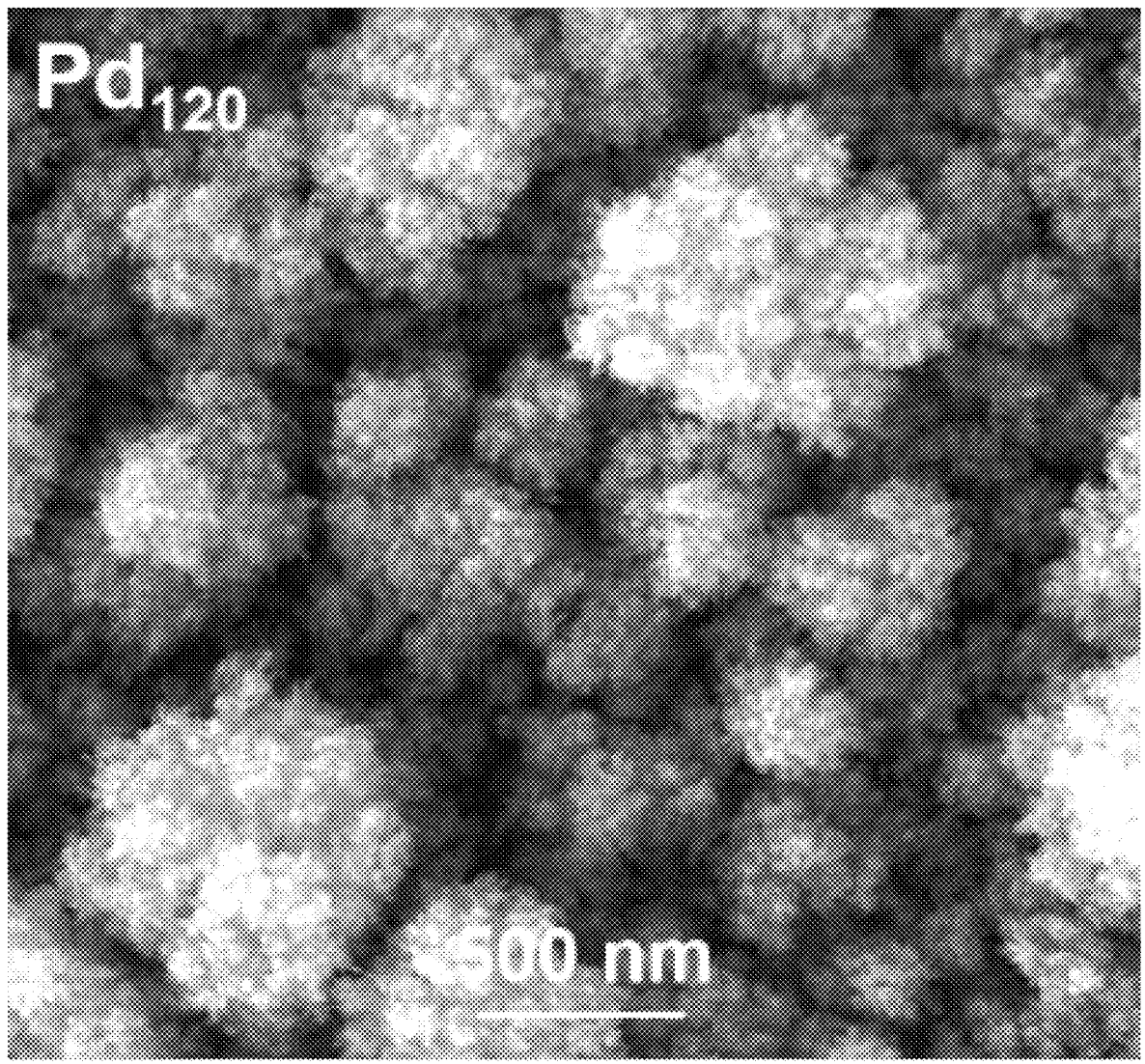
FIG. 1C shows an SEM image for an exemplary palladium film electrode, $Pd_{120}$, deposited for 120 minutes of deposition time on an FTO glass substrate at 475° C. from palladium acetylacetonate via AACVD.
Figure 1D:
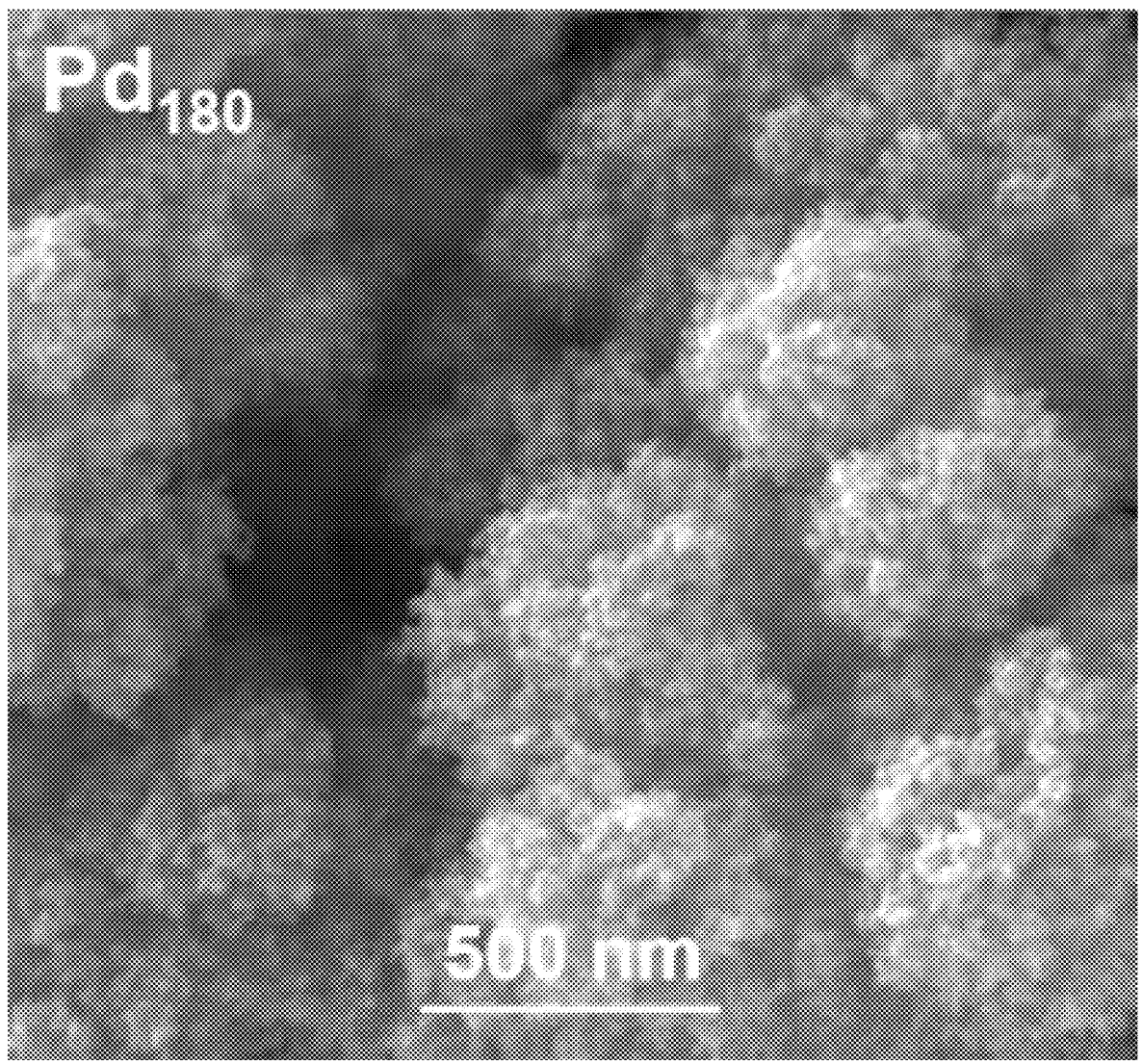
FIG. 1D shows an SEM image for an exemplary palladium film electrode, $Pd_{180}$, deposited for 180 minutes of deposition time on an FTO glass substrate at 475° C. from palladium acetylacetonate via AACVD.
Figure 1E:
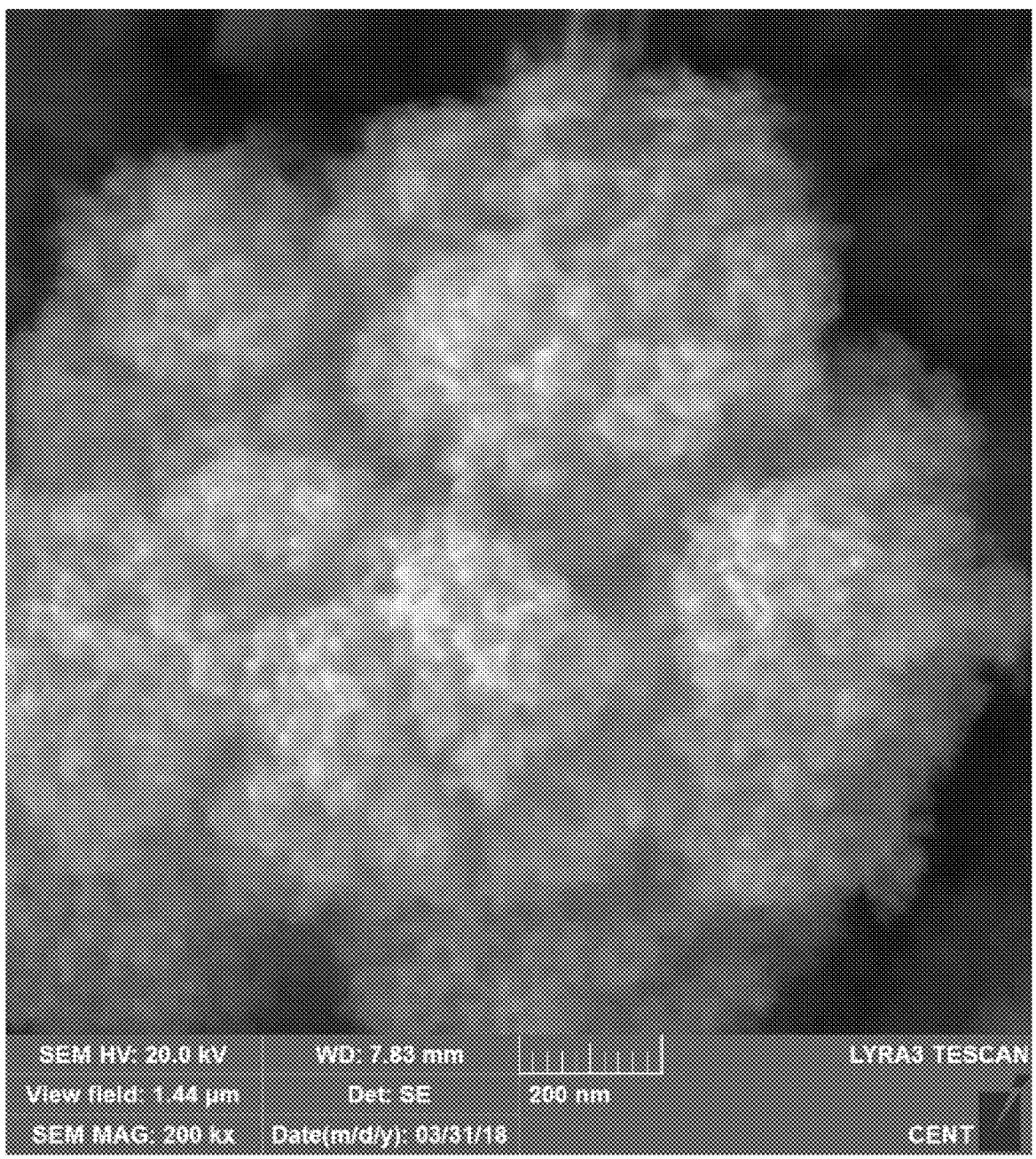
FIG. 1E shows an FESEM image of a surface structure of the sponge catalyst.
Figure 1F:
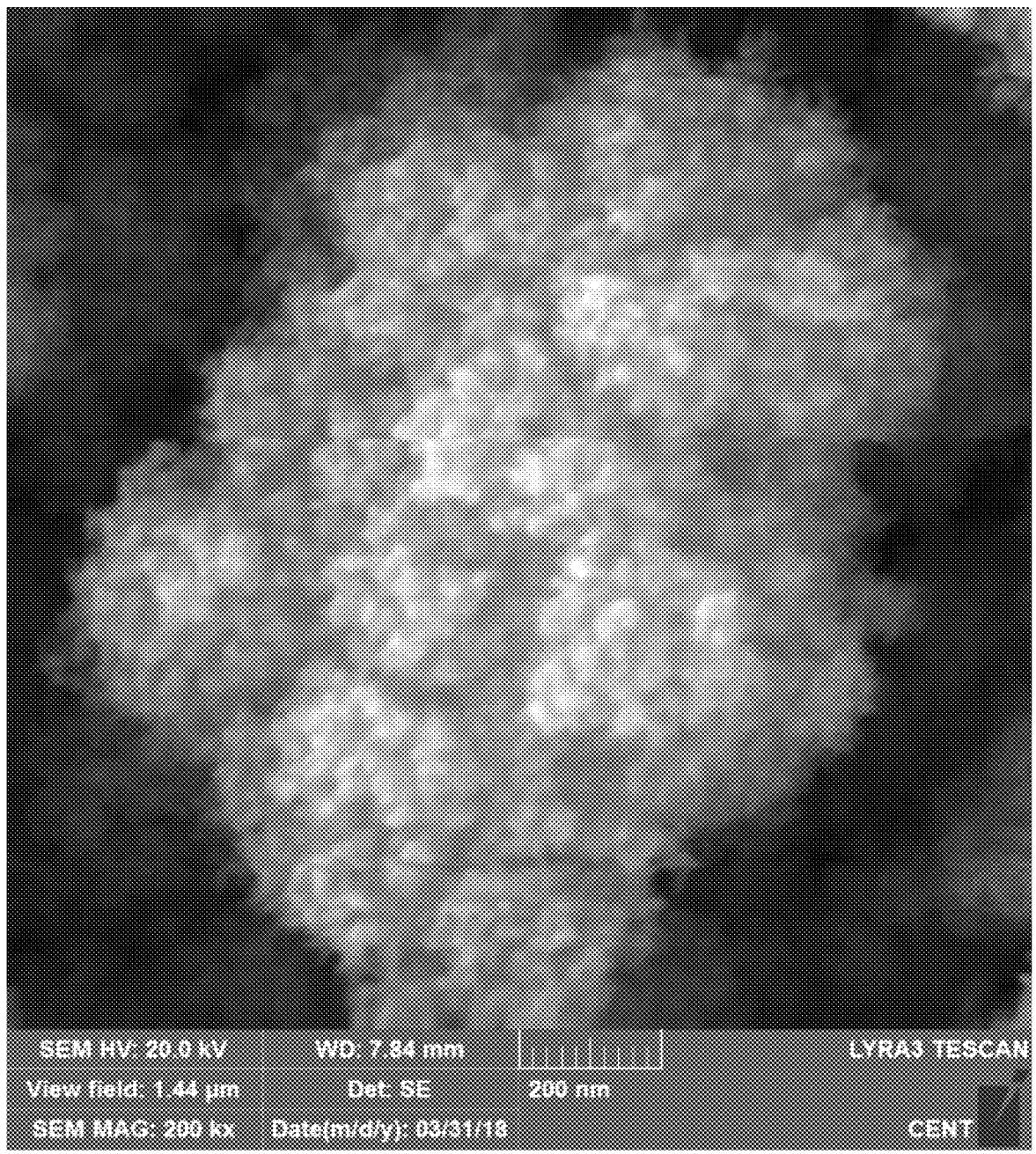
FIG. 1F shows an FESEM image of a surface structure of the sponge catalyst.
Figure 1G:
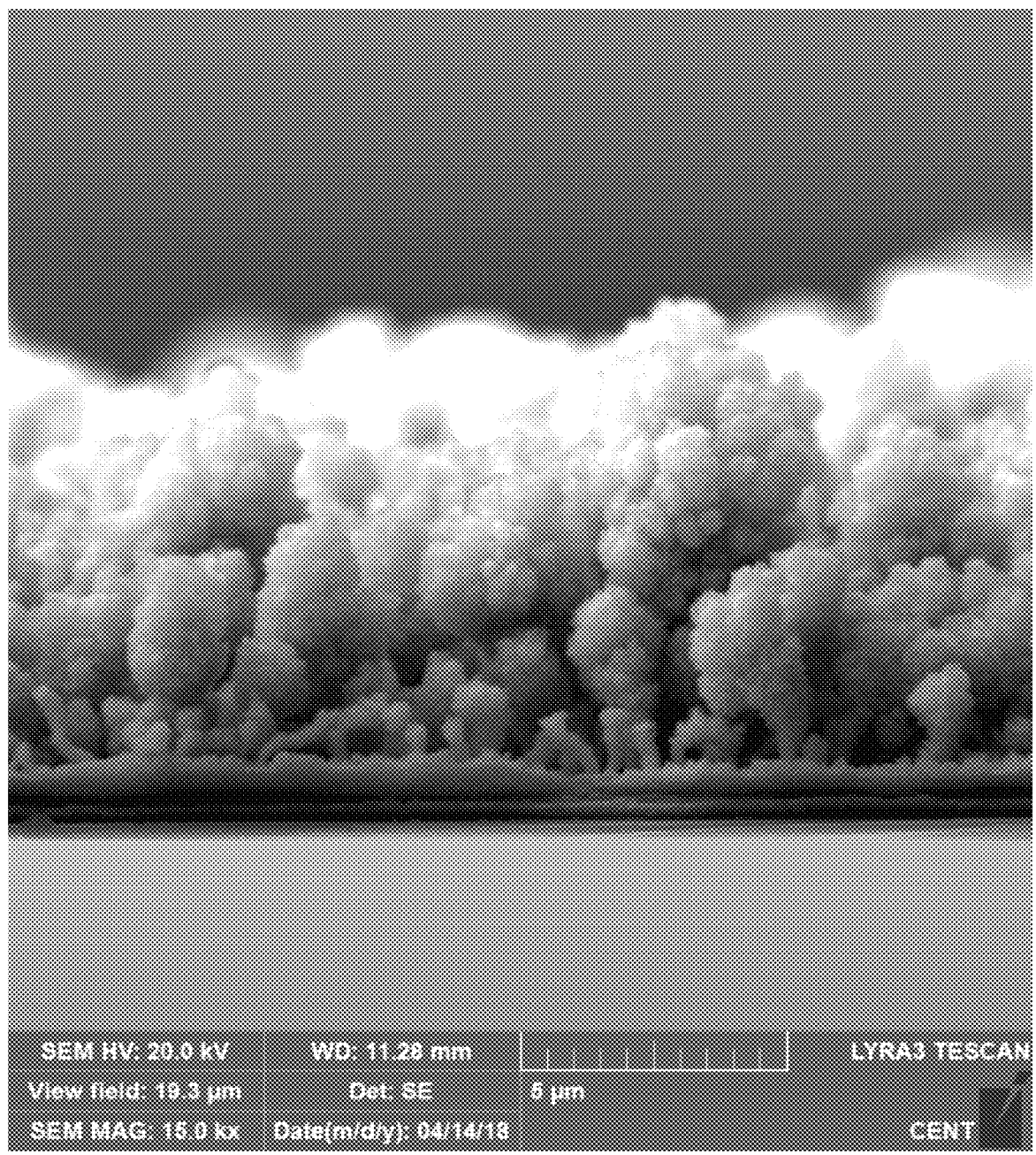
FIG. 1G shows a cross-sectional FESEM image of the spicule nature of palladium sponge catalyst.

FIG. 1A to 1D show scanning electron microscopy (SEM) images of exemplary $Pd_{60}$, $Pd_{90}$, $Pd_{120}$, and $Pd_{180}$ palladium film electrodes prepared as described herein, i.e., respectively using 60, 90, 120 and 180 minute deposition times. As can be observed in the images, the $Pd_{60}$ sample in FIG. 1A shows substantially rounded agglomerations of matter having largest dimensions generally less than 500 nm (for the agglomeration), e.g., generally in a range of from 100 to 500, 150 to 450, 200 to 400, or 250 to 350 nm. The $Pd_{90}$ sample in FIG. 1B shows a less rounded agglomeration morphology, with more flocculent outer volumes, and largest dimensions generally around 500 nm, e.g., 300 to 700, 350 to 650, 400 to 600, or 450 to 550 nm. The $Pd_{120}$ sample in FIG. 1C shows a still recognizable agglomeration morphology, with flocculent/fractal outer volumes, and largest dimensions generally around 750 nm, e.g., 500 to 1000, 600 to 900, 650 to 850, or 700 to 800 nm. The $Pd_{180}$ sample in FIG. 1D shows a morphology without clearly apparent agglomeration of round subunits, but rather a fractal/flocculent outer morphology visually masking any inner subunits beyond the flocculent outer volume, the $Pd_{180}$ sample having largest dimensions generally over 750 nm, e.g., at least 800, 900, 1000, 1100, or 1250 nm, but generally less than 4000, 3500, or 3000 nm.

The SEM images of different Pd samples in FIG. 1A to 1D show increasing spongy texture and fine structure with deposition time and prolonged heating. The Pd based nanostructures are tiny and distributed all over the surface of the substrate, i.e., covering the substrate surface without leaving uncoated areas before agglomerating. The SEM images in FIG. 1A to 1D also show the growth behavior of palladium (Pd) film electrodes with an increase in deposition time from 60 to 180 minutes. The Pd-based film deposited on surface can have a cluster shape morphology, and Pd may make out a majority or at least 75, 80, 85, 90, 91, 92, 92.5, 93, 94, 95, 96, 97, 97.5, 98, 99, 99.1, 99.5, 99.9, or 99.99 wt. % of a total weight of all metals in the coating.

Figure 6A:
FIG. 6A shows a cross-sectional view of a SEM image of a $Pd_{90}$ sample deposited on FTO glass via AACVD.

The morphology and growth of the Pd-comprising film manifest spicules of sponge crystals with multiple sphere-like porous hierarchical structures. Field-emission scanning electron microscopy (FE-SEM) images show that, depending on the deposition time and precursors consumption, samples can grow with similar morphology and increase substantially linearly (e.g., $R^2$ of at least 0.9, 0.925, 0.95, 0.975, 0.98, 0.985, 0.99, 0.995, or 0.999 to a line) with increasing deposition time. Therefore, the porous sphere-like structure can self-propagate, resulting in several nanoparticles reaching several tens to thousands nm higher surface area and high porosity (e.g., 33.3, 40, 45, 50, 55, 60, 65, 66.7, 70, 75, 80, or 85% porosity by volume—empty space versus matter-filled space) of the Pd clusters with the lowest density clusters. Deposited films within the scope of the invention can have microstructures made of spicules of sponge shaped clusters, e.g., at least 10, 15, 20, 25, 35, 50, 75, 100, 125, 150, or 200 nm and/or up to 975, 950, 900, 850, 800, 750, or 700 nm, which may contribute to the high activity values and/or prolonged efficient catalytic oxidation of water. Cross-sectional views of such films indicates that the Pd film thickness increases with deposition time along with heating at 475° C., leading to a spongier texture, as seen in FIG. 6A relative to FIG. 6B. The spongy texture may also be induced in Pd films by longer deposition times, i.e., up to 180 minutes, which may be initiated by prolonged heating.

Figure 2A:
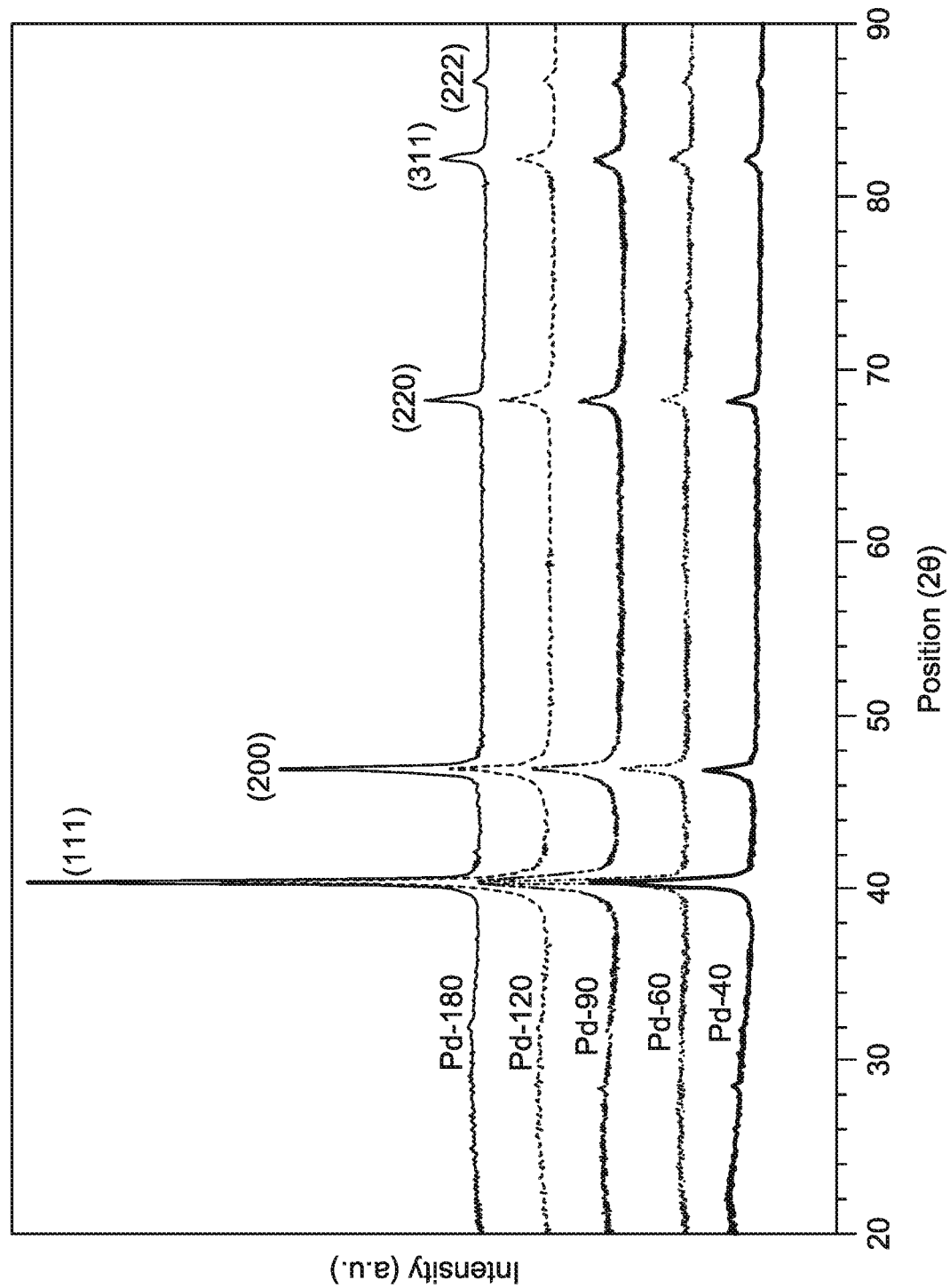
FIG. 2A shows x-ray diffraction (XRD) patterns of exemplary palladium film electrodes, $Pd_{40}$, $Pd_{60}$, $Pd_{90}$, $Pd_{120}$, and $Pd_{180}$ deposited for 40, 60, 90, 120, and 180 minutes of deposition time at 475° C.

FIG. 2A shows overlapped x-ray diffraction (XRD) patterns of $Pd_{40}$, $Pd_{60}$, $Pd_{90}$, $Pd_{120}$, and $Pd_{180}$ palladium film electrodes, made by 40, 60, 90, 120, and 180 minutes of deposition at 475° C. as described in the Examples. The XRD patterns of inventive Pd-comprising films seen in FIG. 2A indicate the deposit to contain metallic palladium, as demonstrated by the reflections in the (111) plane at a $2\theta$ value of 40.0°, in the (200) plane at a $2\theta$ value of 46.5°, in the (220) plane at a $2\theta$ value of 68.0°, in the (311) plane at a $2\theta$ value of 81.0°, and in the (222) plane at a $2\theta$ value of 86.4°, corresponding well with the standard pattern (BD-01-088-2335). The XRD patterns of palladium thin films deposited as described herein, as function of deposition time—40, 60, 90, 120, and 180 minutes—reveal an increase in film crystallinity with deposition time and heating. All XRDs patterns are similar in terms of peak positions ($2\theta$ values) and preferred orientations along 111 planes were observed. The XRD patterns match closely with the standard library card (ICSD 01-088-2335) and reveal the formation of pure palladium in cubic phase. The crystalline phase of palladium remains unchanged when deposition time increases from 40 to 180 minutes. However, the crystallinity of palladium films increases with increased deposition time and heating duration, which can be judged from the peak height of the (111) diffraction at 40.0°. Although, the precursor $Pd(acac)_2$ used in the Examples contained oxygen atoms, its thermal decomposition under inert conditions using AACVD completely decomposed and eliminated the organic moiety in form of $CO_2$ and in the presence of $N_2$, and Pd-oxide formation was not observed from XRD data. Besides the crystallinity of Pd films, no crystalline side product, such as a palladium oxide, was observed in the XRD spectra. All crystalline peaks were in agreement with pure Pd.

FIG. 2B shows high resolution x-ray photoelectron spectroscopy (XPS) spectrum for $Pd_{180}$ showing binding energies for the Pd(0) state for a Pd film deposited from palladium acetylacetonate in toluene solution via AACVD. The oxidation state and nature of Pd in the thin film electrodes was examined by a high-resolution XPS scan of $Pd_{180}$ sample. The doublet at binding energies of 333.5 eV for Pd $3d_{5/2}$ and 339.0 eV for Pd $3d_{3/2}$. These binging energy values are in agreement with the literature reported for metallic $Pd^0$. Minor oxide formation on the palladium surface may be detected by the small shoulder at high binding energies of the palladium 3d peaks. However, in FIG. 2B, the shoulder is substantially absent, suggesting that there was no or only trace formation of oxide on palladium layer. The XPS results are in agreement with the XRD data for the synthesis of substantially impurity-free pure palladium thin films even for longer deposition time, e.g., up to 145, 150, 160, 170, 180, 190, 200, 210, 220, 230, 240 or more minutes.

Figure 3A:
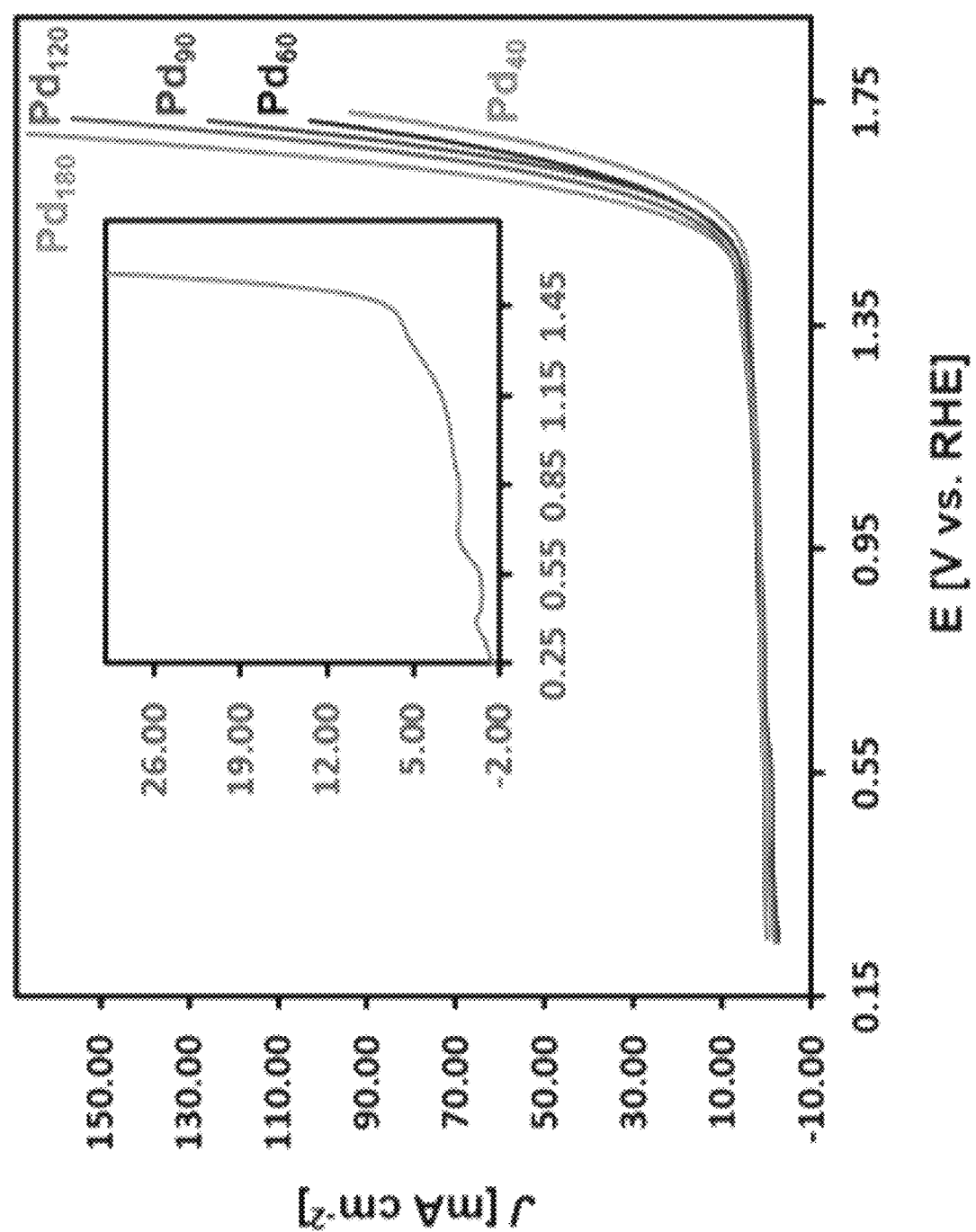
FIG. 3A shows forward potential sweeps for $Pd_{40}$, $Pd_{60}$, $Pd_{90}$, $Pd_{120}$, and $Pd_{180}$ electrocatalytic materials in a 0.1 M KOH electrolyte solution at a scan rate of 20 mV/s, with an inset showing a magnified view of the Linear Sweep Voltammetry (LSV) for $Pd_{180}$ sample.

FIG. 3A shows forward potential sweeps for $Pd_{40}$, $Pd_{60}$, $Pd_{90}$, $Pd_{120}$, and $Pd_{180}$ palladium-containing electrocatalytic materials in 0.1 M KOH electrolyte solutions at a scan rate of 20 mV/s. For water oxidation studies, voltammetry (E/I) experiments were conducted in 0.1 M KOH solutions under forward potentials sweeps. The inset in FIG. 3A shows a magnified view of the linear sweep voltammetry (LSV) for a $Pd_{180}$ sample. The linear sweep voltammetry (LSV) profile in FIG. 3A shows that the Pd derived electrocatalytic films initiates water oxidation reaction at remarkably low overpotentials and reaching very high current densities for oxygen evolution reaction under a small potential window. As seen in FIG. 3A the potential sweeps towards anodic the catalytic wave abruptly increases in magnitude and attains a value greater than 150 mA/cm$^2$ just under the potential of 1.65 V vs RHE of 420 mV) and a current density of 10 mA/cm$^2$ and 100 mA/cm$^2$ is achieved just at 1.47 V ($\eta$ of 240 mV) and 1.63 V ($\eta$ of 400 mV) respectively. The overpotential value to maintain 10 mA/cm$^2$ using $Pd_{180}$ type catalytic films as described herein is lower than the benchmark value of 350 mV at which sustained current density of 10 mA/cm$^2$ is needed for 10% conversion efficiency of solar energy into chemical fuels. These unexpectedly superior features of the inventive Pd film catalyst can make the system relevant for water oxidation tests. All inventive catalytic materials described herein show a low onset overpotentials, i.e., within the range of 200 to 250 mV, e.g., at least 180, 190, 195, 200, 205, 210, or 215 mV and/or no more than 275, 265, 250, 245, 240, 235, 230, 225, 220, or 215 mV, which may be attributed to the highly nanoporous structures. As revealed by SEM imaging seen in FIG. 1A to 1D or FIGS. 6A and 6B, the nanoporous feature of the thin film is enhanced by switching the deposition time from 40 to 180 minutes and as a consequent, an increased current density value and lower overpotential is observed. Enhanced electrocatalytic behavior in the $Pd_{180}$ derived films can be correlated to the porosity, as a highly porous structure can facilitate the efficient charge transfer and mass transport in the catalytic water oxidation process.

Figure 3B:
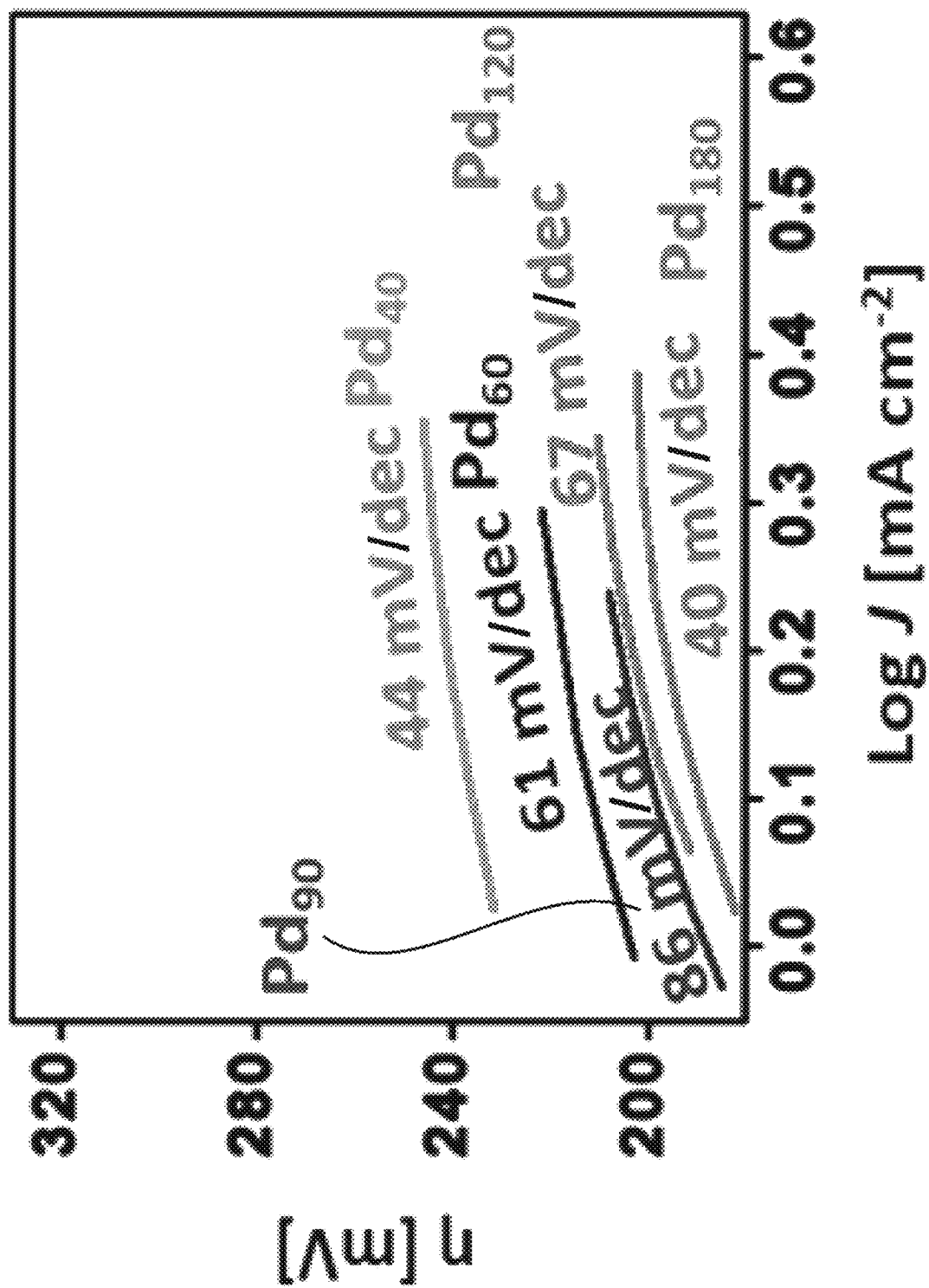
FIG. 3B shows Tafel plots for $Pd_{40}$, $Pd_{60}$, $Pd_{90}$, $Pd_{120}$, and $Pd_{180}$ electrocatalytic materials in a 0.1 M KOH electrolyte solution.

FIG. 3B shows the Tafel plots for $Pd_{40}$, $Pd_{60}$, $Pd_{90}$, $Pd_{120}$, and $Pd_{180}$ palladium-containing electrocatalytic materials in 0.1 M KOH electrolyte solutions. A water oxidation catalyst executing oxygen evolution below 1.55 V against a reversible hydrogen electrode (RHE) is regarded as an excellent oxygen evolution reaction (OER) electrocatalyst material, and Pd samples described herein can operate to achieve OER onset under 1.55 V (vs RHE). The onset potential is sequentially shifting towards the more negative window as the deposition time increases from 40 to 180 minutes. The $Pd_{180}$ film electrocatalyst example can initiate water oxidation at just 1.43 V vs RHE with onset-overpotential of only 200 mV, even initiating at 1.425, 1.40, 1.375, 1.35, 1.325, 1.3 V or less, and/or onset overpotentials down to 210, 205, 200, 195, 190, 185, 180, 175 mV or less. For a sustained and high rates of water oxidation, catalysts should operate over a narrow potential range while producing high current density. Accordingly, the Tafel plots of all exemplary catalysts were obtained, as seen in FIG. 3B, within the linear regions fit into the Tafel equation, i.e., $\eta = b \cdot \log J + a$, where $\eta$ is the overpotential, a is a correction factor, b is Tafel slope, and J is current density (mA/m$^2$) over exchange current density (mA/m$^2$). Almost all the inventive Pd catalysts described herein demonstrate enhanced kinetics while displaying low Tafel slopes as indicated in FIG. 3B. A small Tafel slope indicates well-balanced kinetics during catalysis. The $Pd_{180}$ sample shows a lower Tafel slope, i.e., 40 mV/decade, than other exemplary materials, including $Pd_{40}$ (44 mV/decade), $Pd_{60}$ (61 mV/decade), $Pd_{90}$ (86 mV/decade), and $Pd_{120}$ (67 mV/decade).

Figure 4:
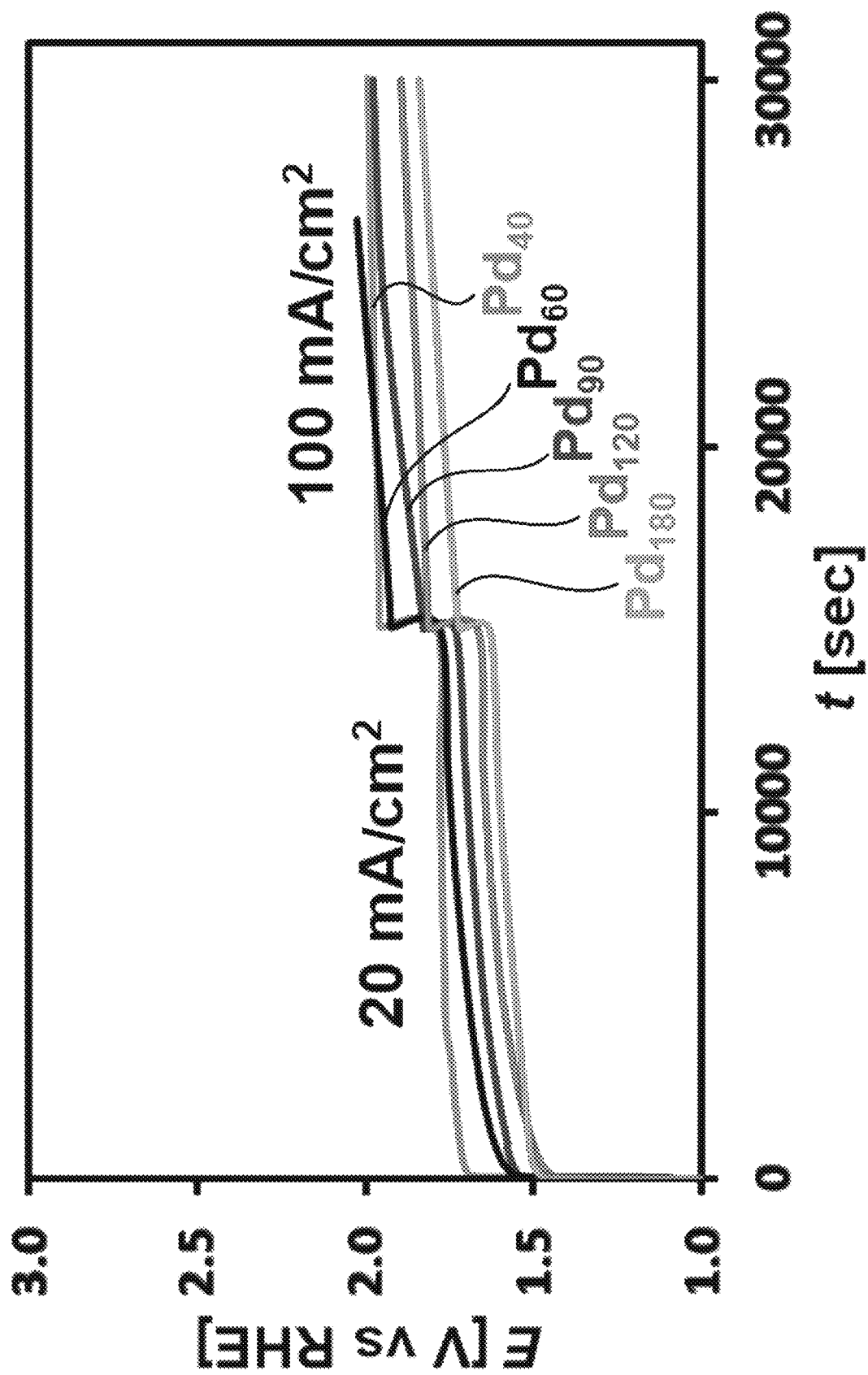
FIG. 4 shows extended time water oxidation tests during controlled-current water electrolysis at $Pd_{40}$, $Pd_{60}$, $Pd_{90}$, $Pd_{120}$, and $Pd_{180}$ electrocatalytic materials in 0.1 M KOH electrolyte solutions at 20 mA/cm² and 100 mA/cm² constant current densities.

FIG. 4 shows extended time water oxidation tests during controlled-current water electrolysis at $Pd_{60}$, $Pd_{90}$, $Pd_{120}$, and $Pd_{180}$ palladium-containing electrocatalytic materials in 0.1 M KOH electrolyte solutions at 20 mA/cm$^2$ and 100 mA/cm$^2$ constant current densities. Long-term catalytic tests for the oxygen evolution reaction (OER) on various Pd film samples indicate high stability of the inventive electrocatalysts for water oxidation under modest electrochemical conditions. Under constant current densities of 20 and 100 mA/cm$^2$, the Pd thin films show sustained potential values for OER under oxidative environments as seen in FIG. 4. The slight shift in the potentials in some cases can be attributed to the accumulation of high oxygen density at the electrode surfaces, thus covering the active catalysis sites. A continuous stream of oxygen bubbles may be seen coming out of electrode surface during CCE experiments owing to high oxygen evolution rates with $Pd_{40}$, $Pd_{60}$, $Pd_{90}$, $Pd_{120}$ and $Pd_{180}$ electrocatalytic materials. The higher current density values and superior stabilities can be attributed to the high catalytic activity of inventive catalysts under such conditions.

FIG. 5 shows an exemplary arrangement of an reaction apparatus useful for preparing the electrodes described herein. In the arrangement in FIG. 5, a precursor suspension/solution 1 containing the Pd compound generally in a solvent, such as Pd(acac)$_2$ in toluene is provided for heating and or agitation on an agitator 3, such as an ultrasonic humidifier, an oil bath or heating mantle with magnetic stirring or a stirring apparatus. One or more feeds of a carrier gas supply 2, e.g., comprising Ar, N$_2$, He, air, O$_2$-depleted air, etc., can be led into the vessel comprising the precursor suspension/solution 1, either directly into the liquid or above the liquid. A substrate 4, such as slides of glass, particularly FTO glass, may be arranged downstream of the precursor suspension/solution 1 vessel, for example, directly connected by at least one pipe optionally without any intervening reactive element (optionally a filter, for example) to a oven/furnace 5, such as a tube furnace, containing one or more reactors 6, which may also be tube-shaped, planar, rectangular prismic, or the like. One or more exit pipes from the reactors 6 in the oven/furnace 5 may lead the gases exiting the reactors 6 through a scrubber or gas trap 7, whereafter off-gasses are released as exhaust 8. Modifications of such arrangements may contain one or more recycles or loop-backs from downstream of the oven/furnace 5 and/or the gas trap 7 to the precursor suspension/solution 1 and/or to just upstream of the oven/furnace 5.

Figure 6B:
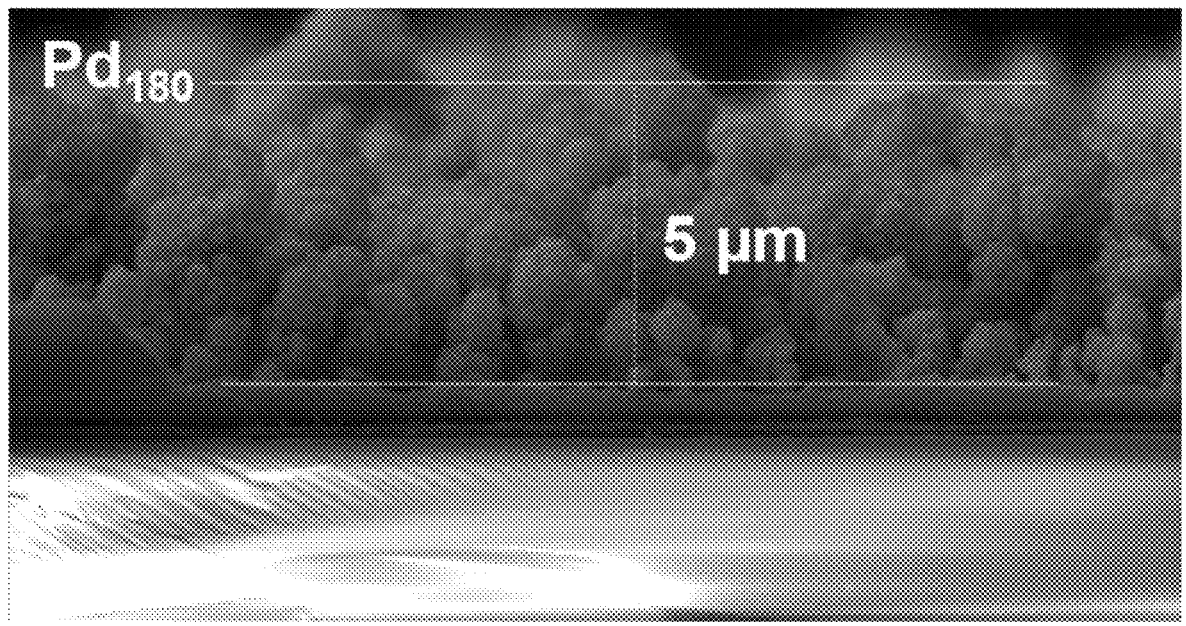
FIG. 6B shows a cross-sectional view of a SEM image of a $Pd_{180}$ sample deposited on FTO glass via AACVD.
Figure 7A:
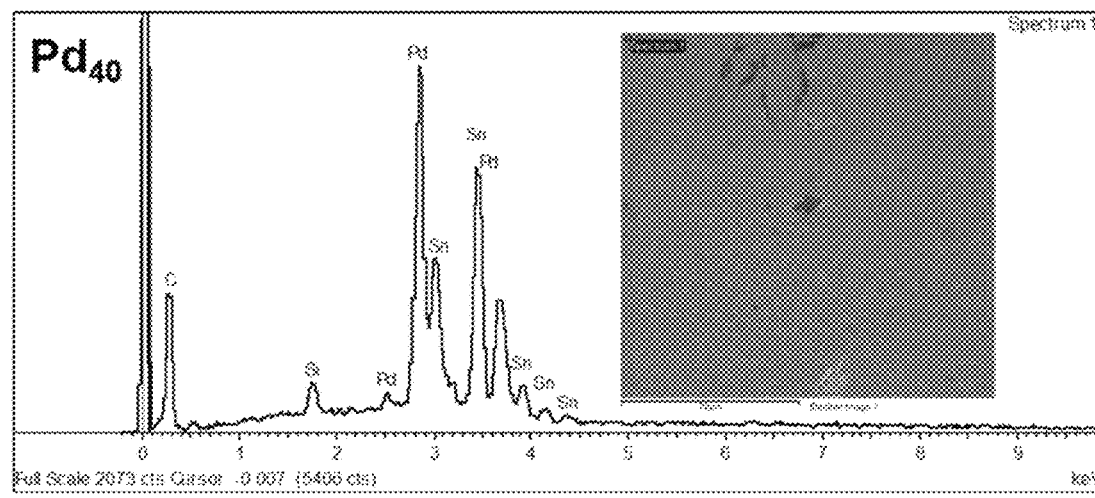
FIG. 7A shows an energy-dispersive X-ray spectroscopy (EDX) spectrum of an exemplary $Pd_{40}$ films deposited on FTO glass substrate via AACVD.
Figure 7B:
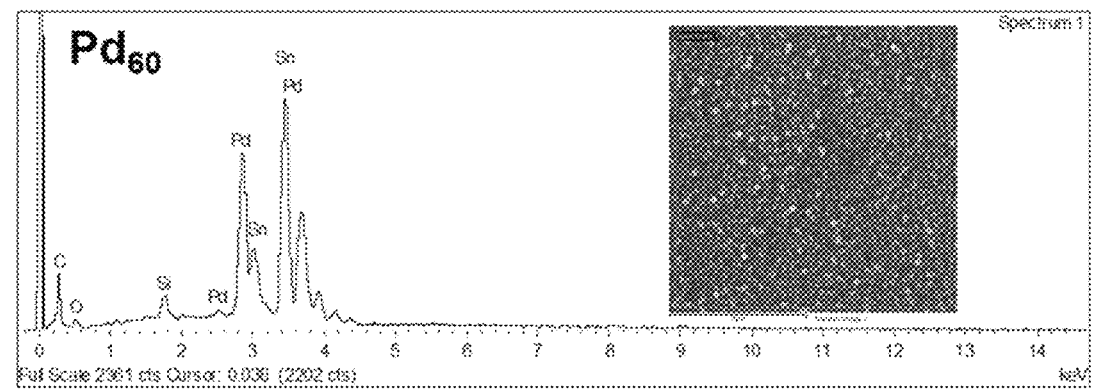
FIG. 7B shows an EDX spectrum of an exemplary $Pd_{60}$ film deposited on FTO glass substrate via AACVD.
Figure 7C:
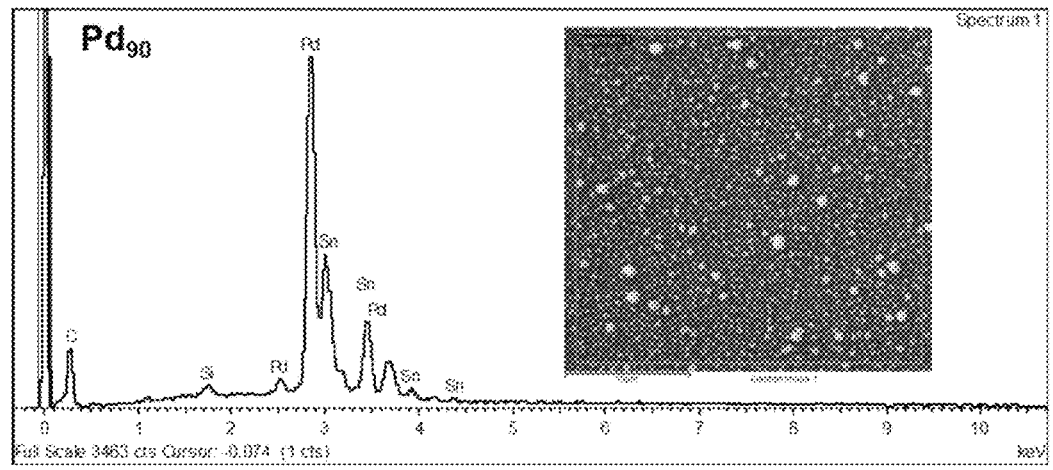
FIG. 7C shows an EDX spectrum of an exemplary $Pd_{90}$ film deposited on FTO glass substrate via AACVD.
Figure 7D:
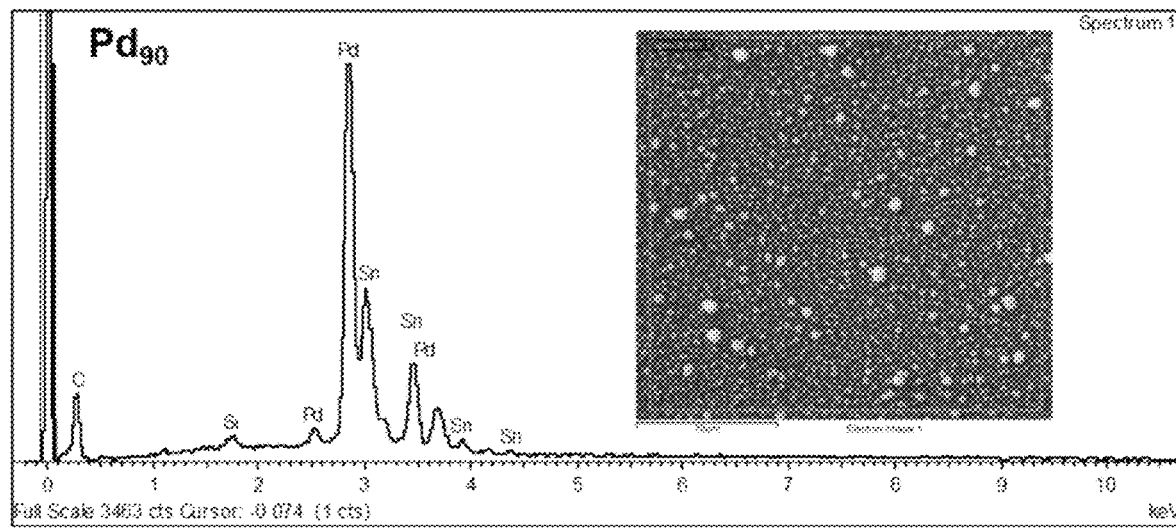
FIG. 7D shows an EDX spectrum of an exemplary $Pd_{120}$ film deposited on FTO glass substrate via AACVD.
Figure 7E:
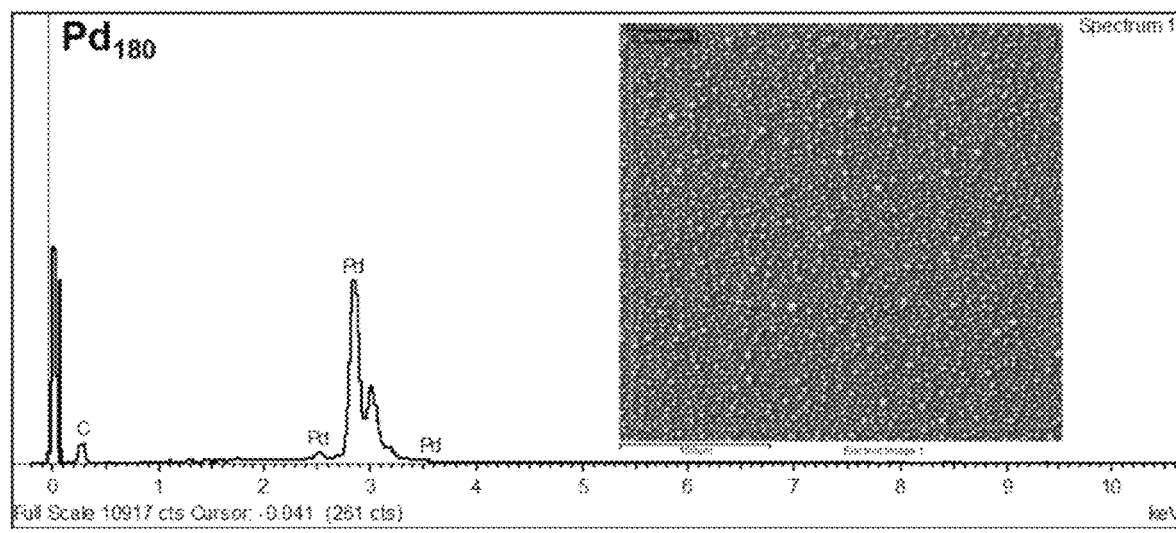
FIG. 7E shows an EDX spectrum of an exemplary $Pd_{180}$ film deposited on FTO glass substrate via AACVD.

FIGS. 6A and 6B show cross-sectional scanning electron microscopy (SEM) images for $Pd_{90}$ and $Pd_{180}$ samples deposited on FTO glass substrates via Aerosol-Assisted Chemical Vapor Deposition (AACVD) method. As can be observed from FIGS. 6A and 6B, the morphology of the deposition takes on a cauliflower-like form in the $Pd_{180}$ sample, and the thickness of the $Pd_{90}$ deposited layer in FIG. 6A at its highest point is not more than 750 nm, e.g., up to 750, 725, 700, 675, 650, 625, or 600 nm, while the $Pd_{180}$ deposited layer in FIG. 6B at its highest point at least 4000, 4250, 4500, 4750, 5000, or 5250 μm.

FIGS. 7A to 7E show energy-dispersive x-ray spectroscopy (EDX) spectra of $Pd_{40}Pd_{60}$, $Pd_{90}$, $Pd_{120}$, and $Pd_{180}$ films deposited on FTO substrate via Aerosol-Assisted Chemical Vapor Deposition (AACVD). FIG. 7A to 7E present compositional analyses of the Pd films fabricated at different deposition times via EDX analysis. EDX elemental analysis reveals the presence of Pd in the deposited films along with some minor signals from oxygen and carbon. The background signatures seem to disappear as the thickness of the Pd films increases, e.g., with deposition time. Carbon assimilation from the organic precursor, i.e., acetoacetate in the case of the Examples, is also observed at the low end of the spectrum. However, Pd contents are dominant in the deposited catalytic films, as seen around 3 keV.

Figure 8:
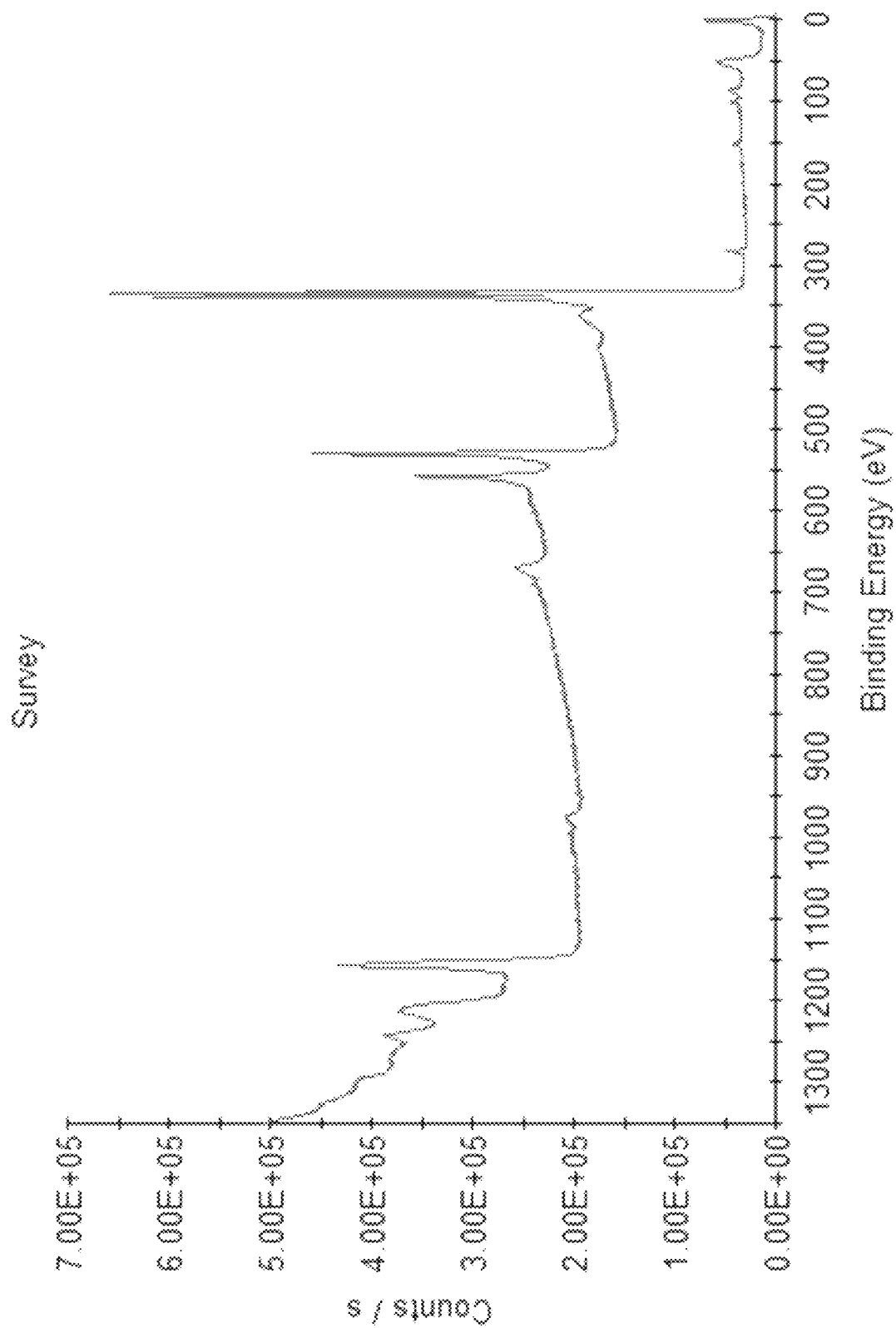
FIG. 8 shows an x-ray photoelectron spectroscopy (XPS) survey pattern of an exemplary palladium film electrode.

FIG. 8 shows x-ray photoelectron spectroscopy (XPS) survey patterns of palladium film electrodes. The surface composition of Pd type electrocatalytic films were analyzed by these XPS experiments, whereby the survey spectrum reveals that catalyst contains Pd as the main constituent element.

Figure 9:
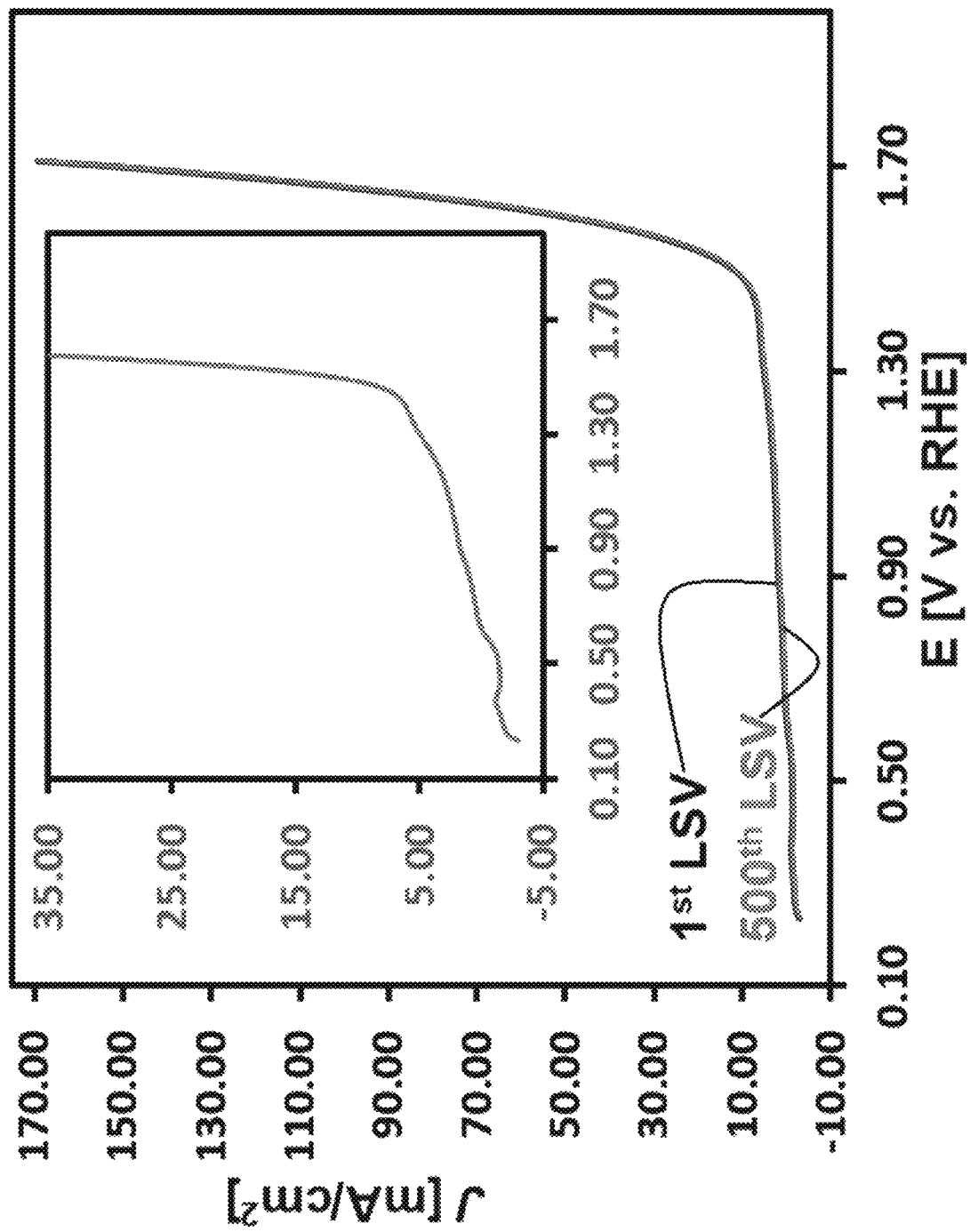
FIG. 9 shows forward potential sweeps during 1st and 500th linear sweep voltammetry (LSV) run for $Pd_{180}$ electrocatalytic material in 0.1 M KOH electrolyte solution at the scan rate of 10 mV/s, while the inset shows an enlarged view of the LSV in 0.1 M KOH electrolyte solution.

FIG. 9 shows forward potential sweeps during the 1$^{st}$ and 500$^{th}$ linear sweep voltammetry (LSV) run for $Pd_{180}$ electrocatalytic material in a 0.1 M KOH electrolyte solution at the scan rate of 10 mV/s. The inset in FIG. 9 shows an enlarged view of the LSV in 0.1 M KOH electrolyte solution. FIG. 9 represents an evaluation of the stability of the exemplary $Pd_{180}$ catalyst was evaluated by repetitive LSV scans under similar electrochemical conditions. The catalyst can produce substantially similar electrochemical signals at $1^{st}$ and $500^{th}$ CV cycle signifying no loss, or no more than 10, 7.25, 5, 4, 3, 2, 1, 0.5, or 0.1% loss, of catalytic performance under vigorous oxidative conditions. The catalytic efficiency of inventive materials can be demonstrated by comparing the mass activity and turn over frequency of all sample catalysts, preferably at 0.35 V. The $Pd_{180}$ material outperforms other catalysts at 0.35 V, as can be seen in Table 1, showing values of 560 mA/mg mass activity (MA) and 0.2 Hz time of flight (TOF) at 0.35 V.

TABLE 1

Summary of electrocatalytic activity for Pd-derived thin film electrocatalysts.

| Catalyst | η@10 mA/cm² [mV] at η = 0.35 V | Tafel slope [mV/decade] | Mass Activity [mA/mg] | ECSA [cm²] | TOF (Hz) at η of 0.35 V |
|---|---|---|---|---|---|
| $Pd_{40}$ | 340 | 44 | 207 | 4.3 | 0.05 |
| $Pd_{60}$ | 330 | 61 | 258 | 4.8 | 0.07 |
| $Pd_{90}$ | 310 | 86 | 292 | 7.2 | 0.08 |
| $Pd_{120}$ | 270 | 67 | 392 | 8 | 0.1 |
| $Pd_{180}$ | 240 | 40 | 560 | 20 | 0.2 |

The electroactive area analysis indicates that the $Pd_{180}$ sample has higher electroactive sites, i.e., ECSA of 20 cm², available for charge transfer during catalytic process, as seen in Table 1 and FIGS. 10 to 14.

Figure 10A:
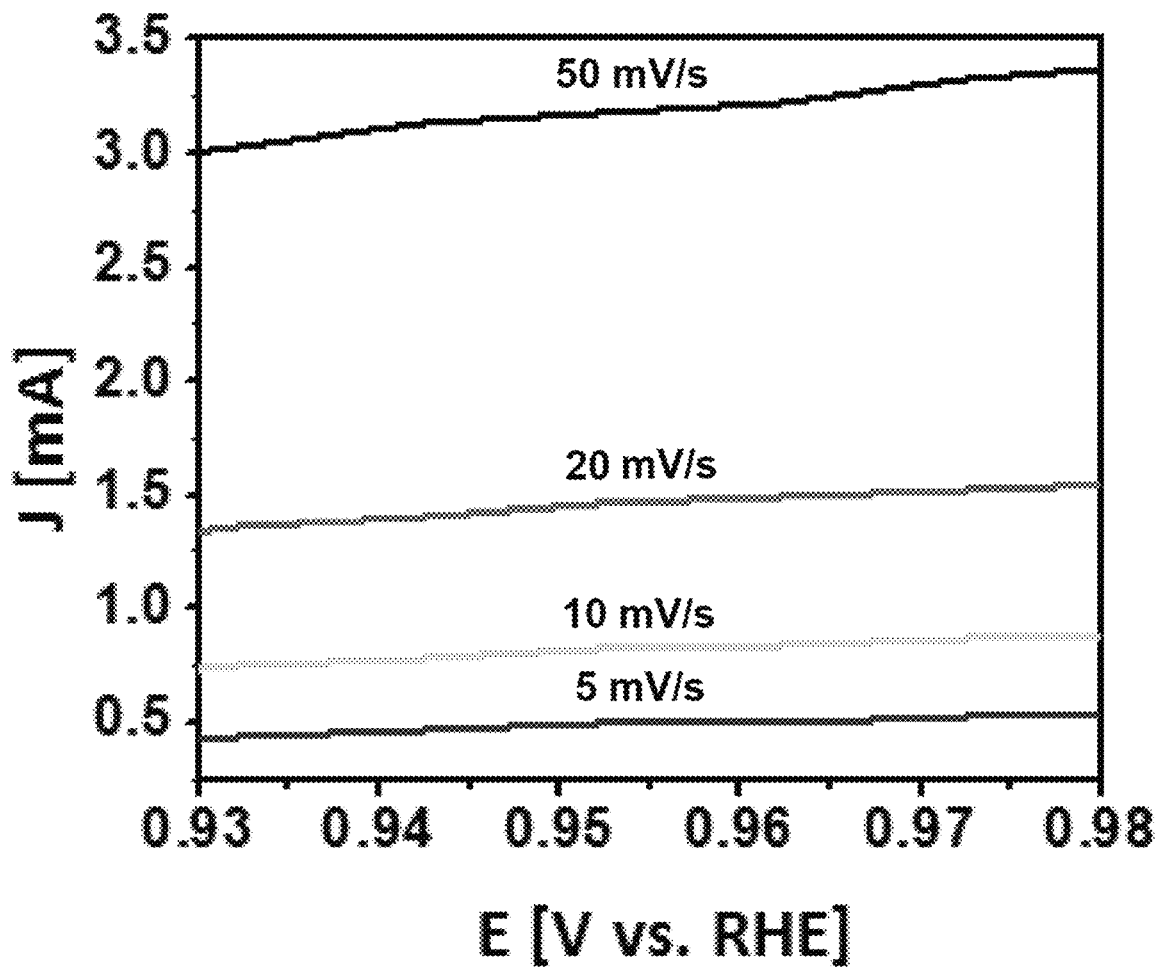
FIG. 10A shows a cyclic voltammogram for $Pd_{40}$ in a 0.1 M KOH electrolyte solution measured at varying scan rates, i.e., 5 mV/s, 10 mV/s, 20 mV/s, and 50 mV/s, in the non-faradaic region where all current should be due to capacitive charging.
Figure 10B:
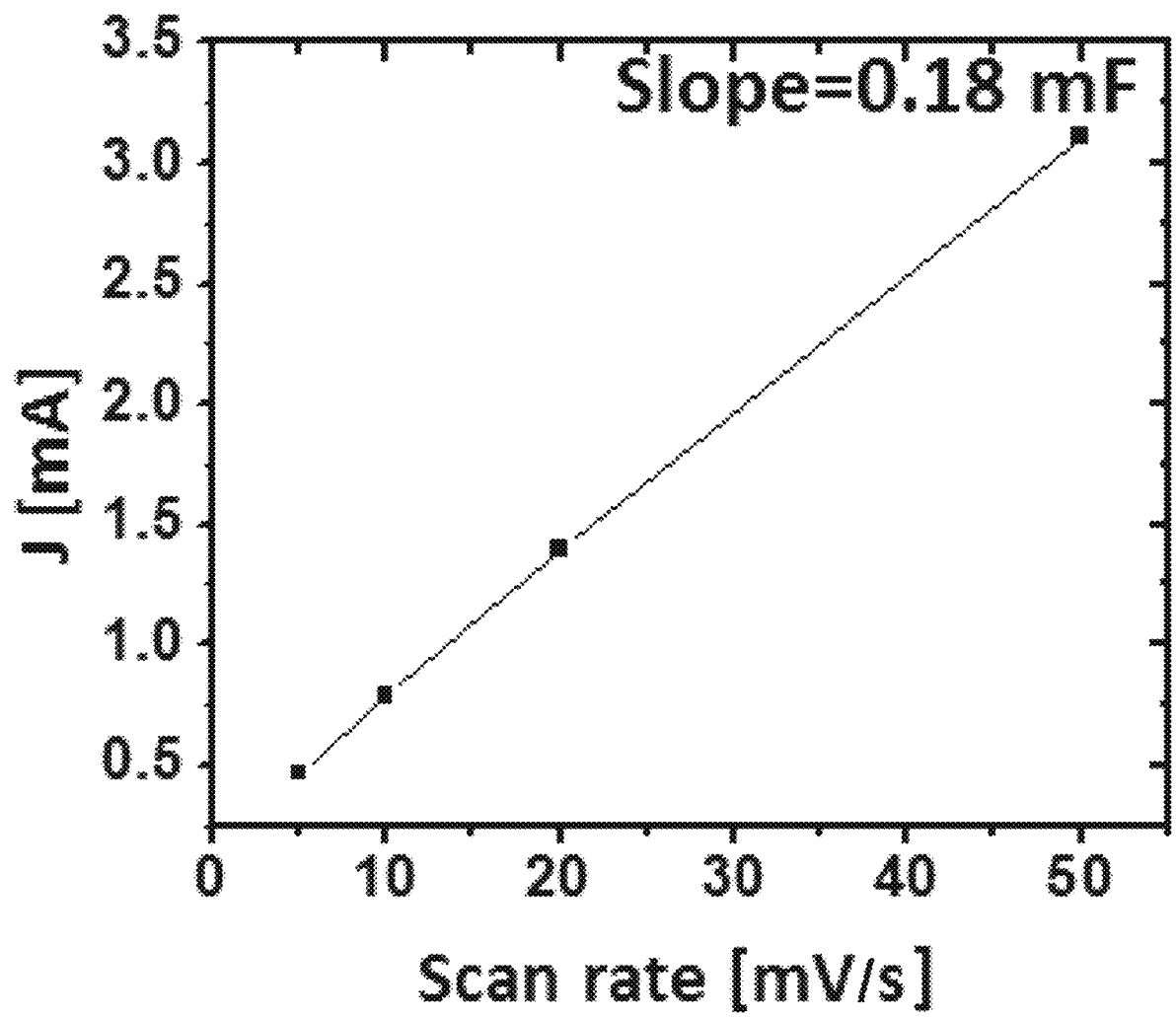
FIG. 10B shows a plot of charging current at a fixed potential of 0.955 V against a reversible hydrogen electrode (RHE) as a function of scan rate, with the slope giving the value of the double-layer capacitance, $C_{dl}$, and the electrochemically active surface area indicated to be 4.3 cm².

FIGS. 10A and 10B show double layer capacitance measurements for evaluating the electrochemically active surface area for $Pd_{40}$ type electrocatalytic system in 0.1 M KOH electrolyte solution. FIG. 10A shows a cyclic voltammogram for $Pd_{40}$ measured at varying scan rate such as 5 mV/s, 10 mV/s, 20 mV/s, and 50 mV/s in the non-faradaic region, where all the current is supposed to be due to capacitive charging. FIG. 10B shows charging current at the fixed potential of 0.955 V against a reversible hydrogen electrode (RHE) plotted as a function of scan rate with the slope giving the value of the double-layer capacitance, $C_{dl}$. The electrochemically active surface area of the sample can be determined to be 4.3 cm².

Figure 11A:
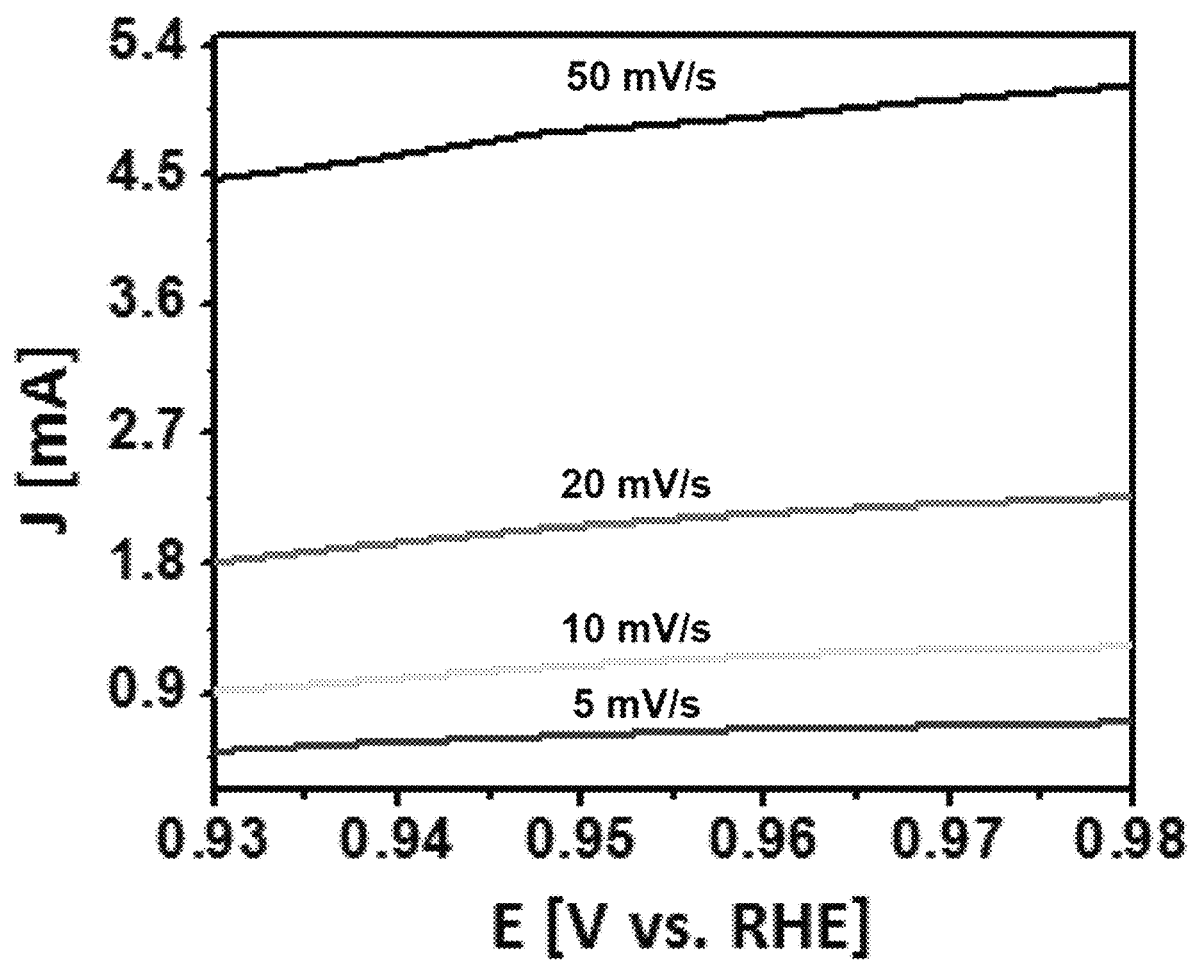
FIG. 11A shows a cyclic voltammogram for $Pd_{60}$ in a 0.1 M KOH electrolyte solution measured at varying scan rates, i.e., 5 mV/s, 10 mV/s, 20 mV/s, and 50 mV/s, in the non-faradaic region where all current should be due to capacitive charging.
Figure 11B:
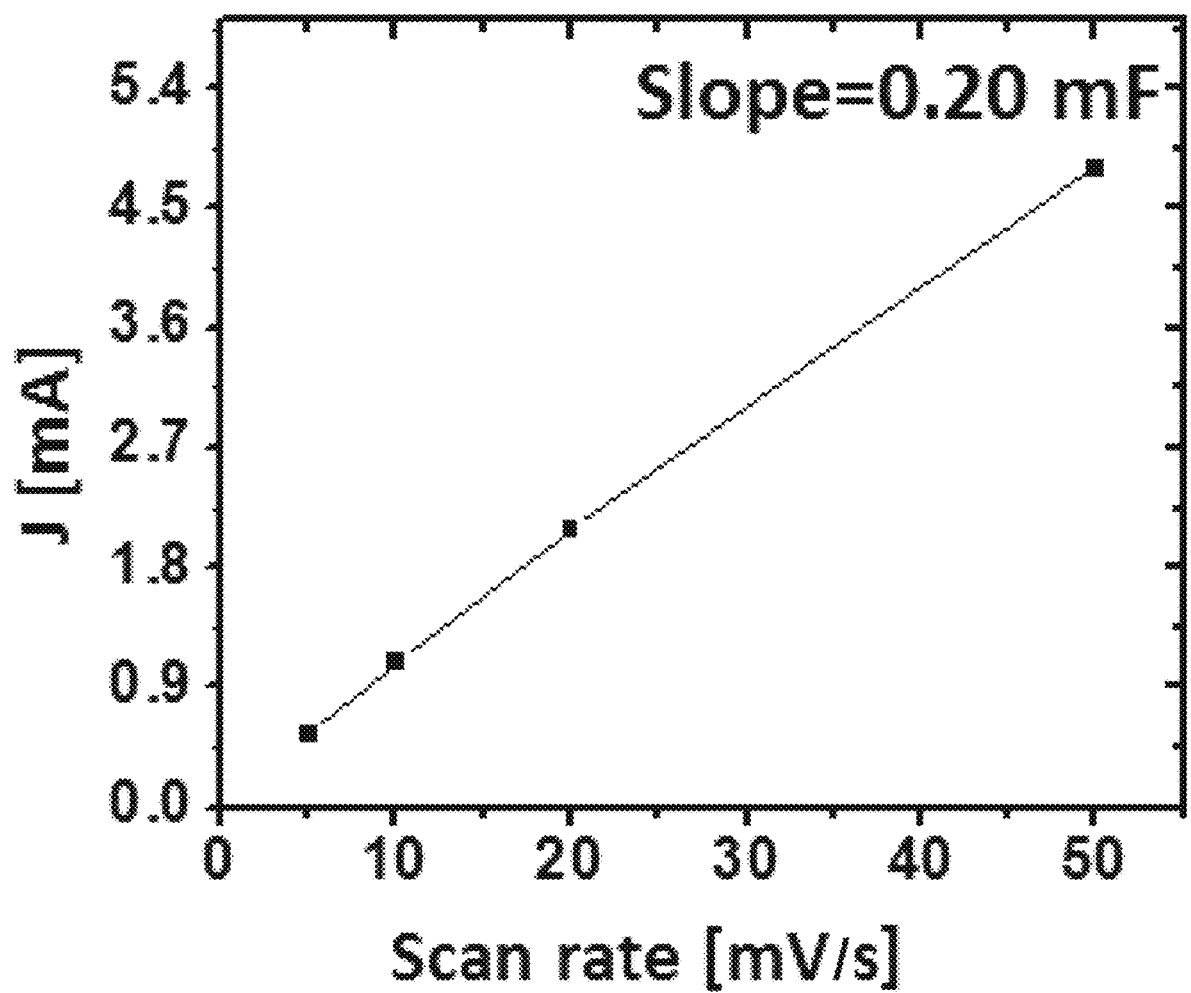
FIG. 11B shows a plot of current at a fixed potential of 0.955 V vs. RHE as a function of scan rate, with the slope giving the value of the double-layer capacitance, $C_{dl}$, and the electrochemically active surface area indicated to be 4.8 cm².

FIGS. 11A and 11B show double layer capacitance measurements for evaluating electrochemically active surface area for $Pd_{60}$ type electrocatalytic system in 0.1 M KOH electrolyte solution. FIG. 11A shows a cyclic voltammogram for $Pd_{60}$ measured at varying scan rate such as 5 mV/s, 10 mV/s, 20 mV/s, and 50 mV/s in the non-faradaic region, where all the current is supposed to be due to capacitive charging. FIG. 11B shows charging current at the fixed potential of 0.955 V against a reversible hydrogen electrode (RHE) is plotted as a function of scan rate while slope giving the value of the double-layer capacitance, $C_{dl}$. The electrochemically active surface area of the sample can be determined to be 4.8 cm².

Figure 12A:
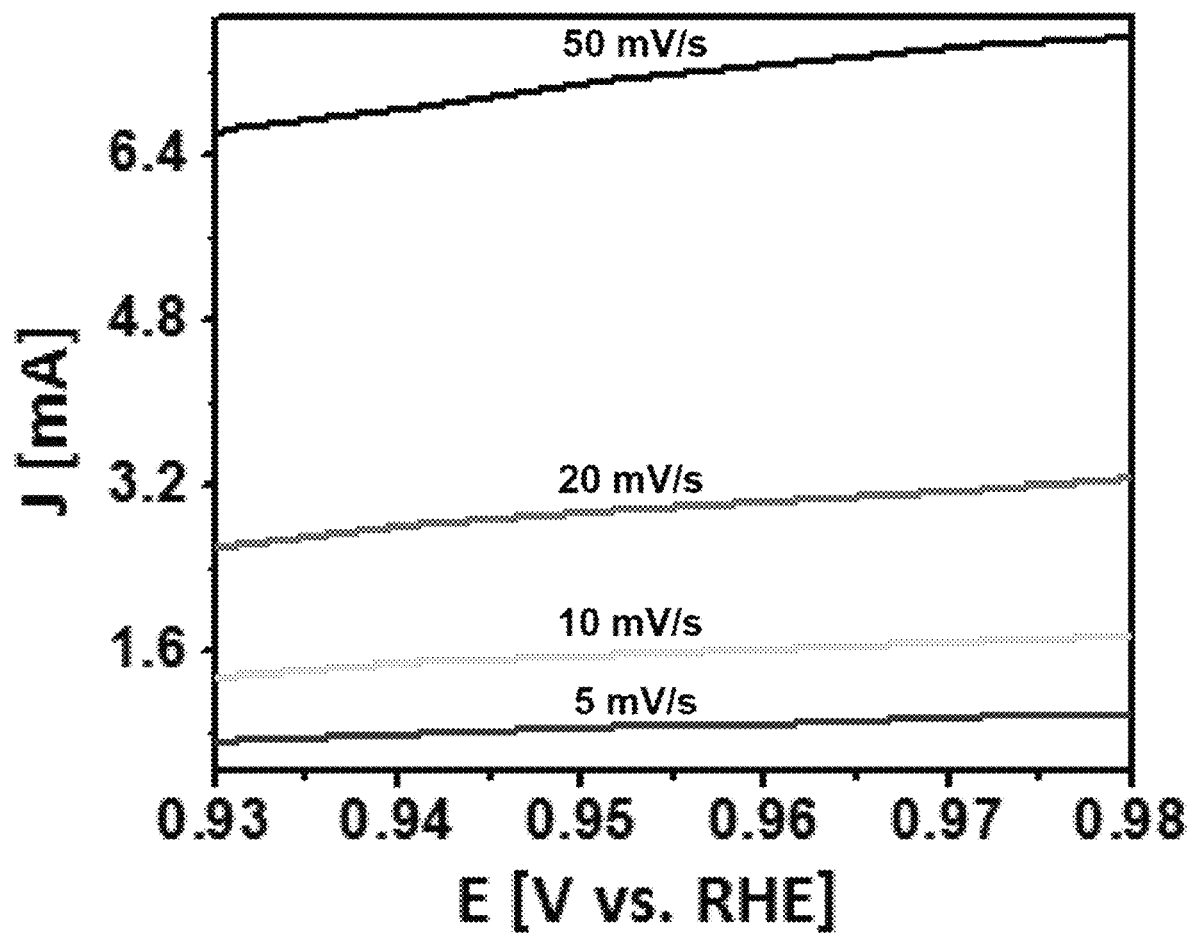
FIG. 12A shows a cyclic voltammogram for $Pd_{90}$ in a 0.1 M KOH electrolyte solution measured at varying scan rates, i.e., 5 mV/s, 10 mV/s, 20 mV/s, and 50 mV/s, in the non-faradaic region where all current should be due to capacitive charging.
Figure 12B:
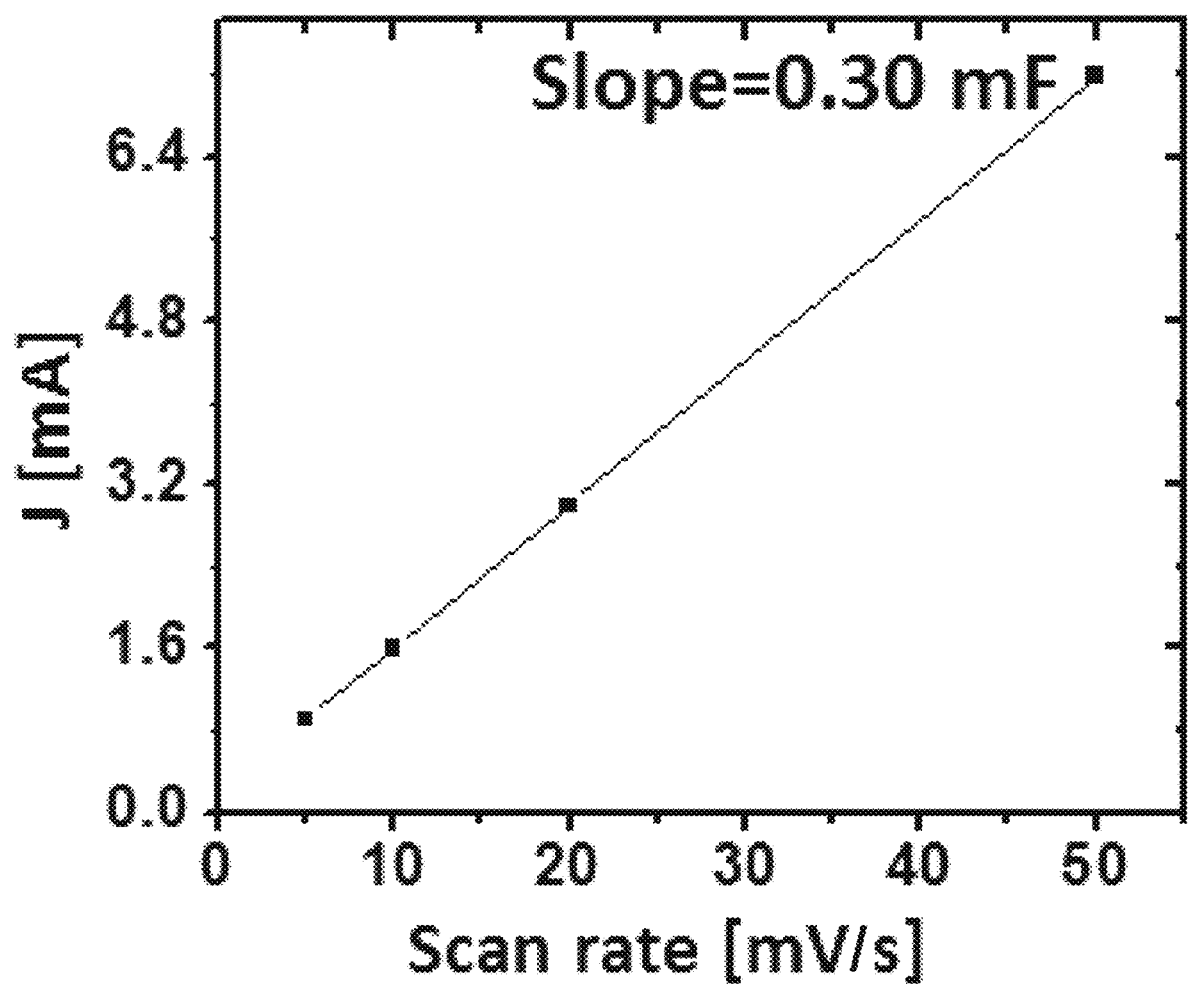
FIG. 12B shows a plot of current at a fixed potential of 0.955 V vs. RHE as a function of scan rate, with the slope giving the value of the double-layer capacitance, $C_{dl}$, and the electrochemically active surface area indicated to be 7.2 cm².
Figure 13A:
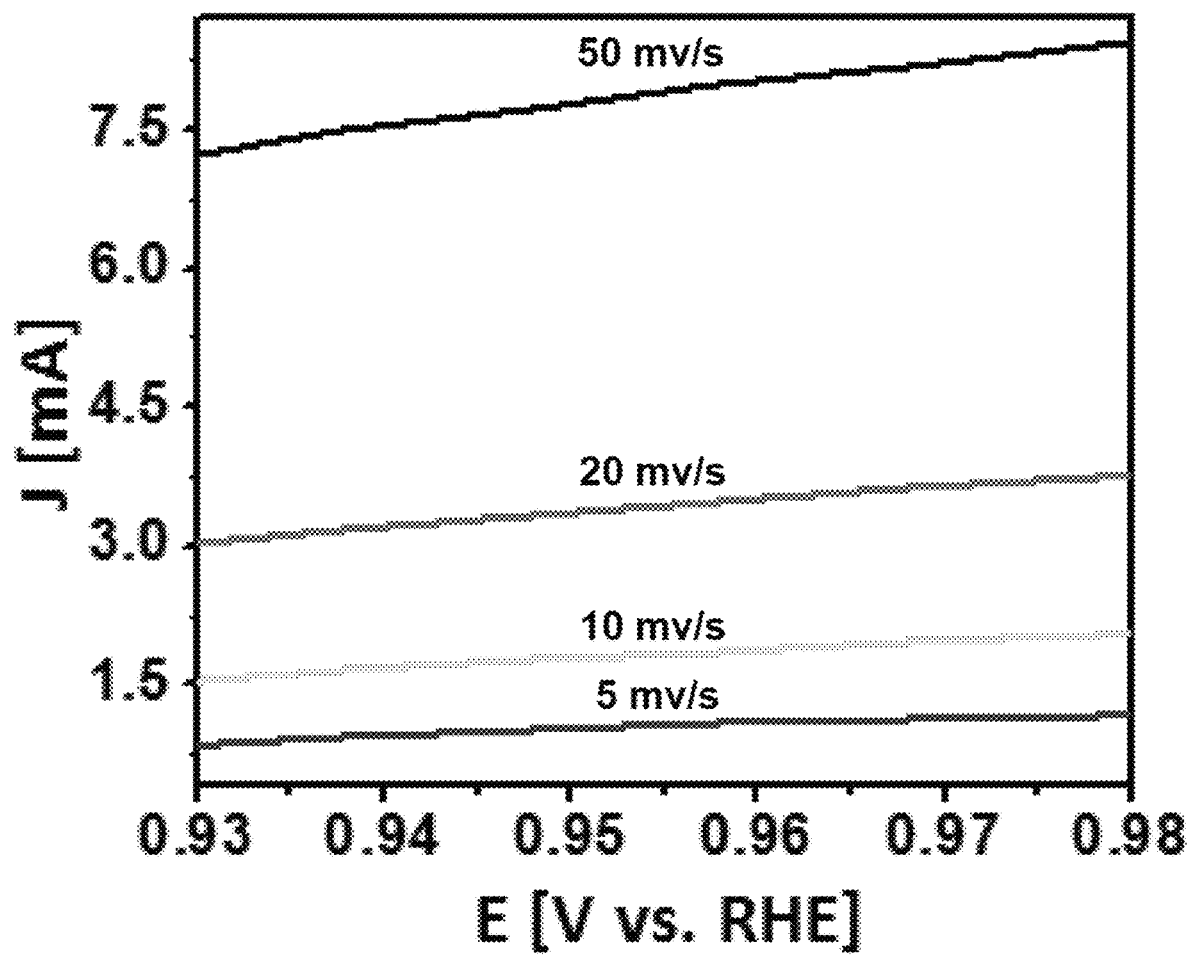
FIG. 13A shows a cyclic voltammogram for $Pd_{120}$ in a 0.1 M KOH electrolyte solution measured at varying scan rates, i.e., 5 mV/s, 10 mV/s, 20 mV/s, and 50 mV/s, in the non-faradaic region where all current should be due to capacitive charging.
Figure 13B:
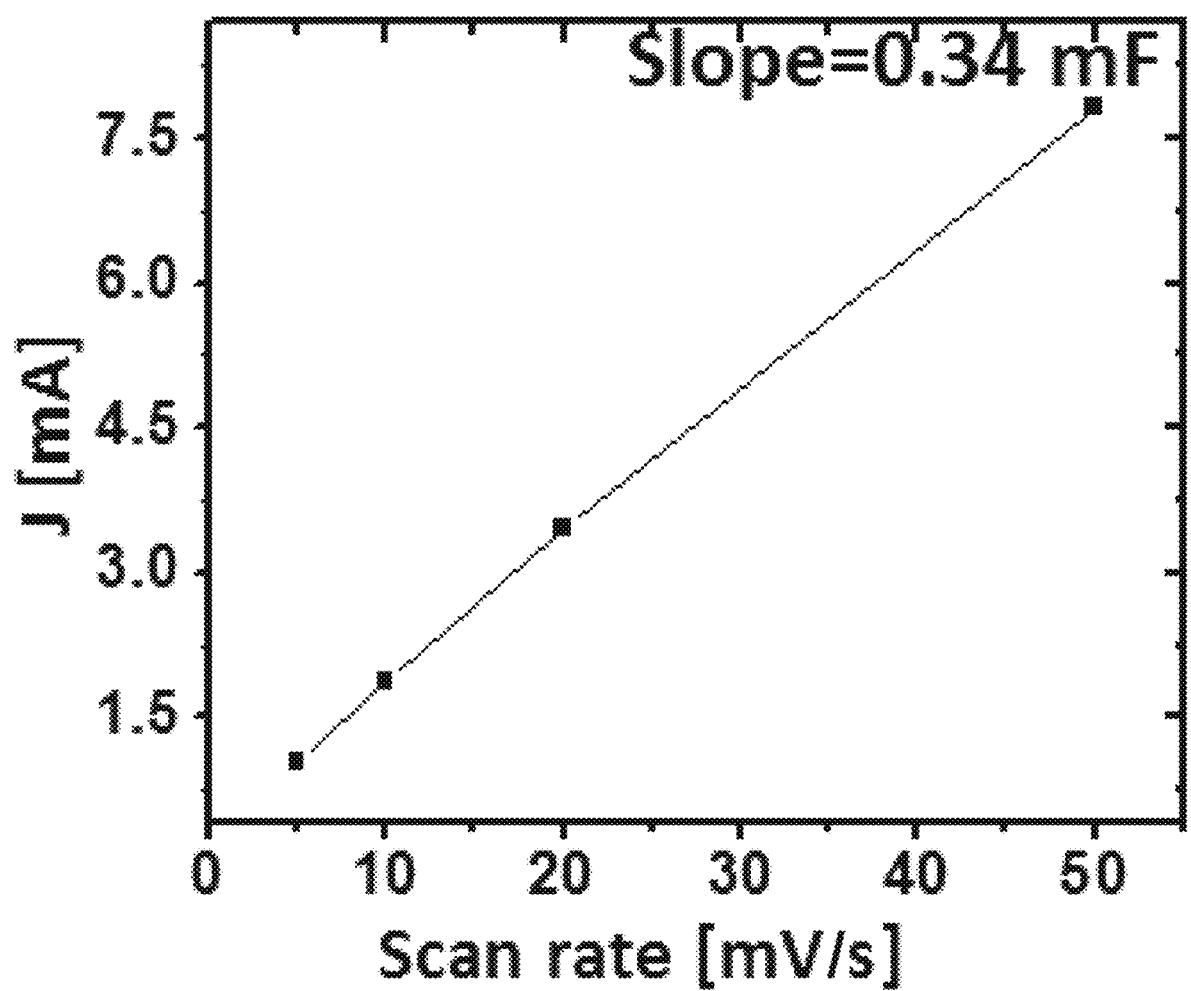
FIG. 13B shows a plot of current at a fixed potential of 0.955 V vs. RHE as a function of scan rate, with the slope giving the value of the double-layer capacitance, $C_{dl}$, and the electrochemically active surface area indicated to be 8 cm².

FIGS. 12A and 12B show double layer capacitance measurements for evaluating electrochemically active surface area for $Pd_{90}$ type electrocatalytic system in 0.1 M KOH electrolyte solution. FIG. 12A shows a cyclic voltammogram for $Pd_{90}$ measured at varying scan rate, exemplified using 5 mV/s, 10 mV/s, 20 mV/s, and 50 mV/s in the non-faradaic region, where all the current should be due to capacitive charging. FIG. 12B shows charging current at the fixed potential of 0.955 V against a reversible hydrogen electrode (RHE) is plotted as a function of scan rate while slope giving the value of the double-layer capacitance, $C_{dl}$. The electrochemically active surface area of the sample can be determined to be 7.2 cm². FIGS. 13A and 13B show double layer capacitance measurements for evaluating electrochemically active surface area for $Pd_{120}$ type electrocatalytic system in 0.1 M KOH electrolyte solution. FIG. 13A shows a cyclic voltammogram for $Pd_{120}$ measured at varying scan rate, exemplified using 5 mV/s, 10 mV/s, 20 mV/s, and 50 mV/s in the non-faradaic region, where all the current should be due to capacitive charging. FIG. 13B shows a charging current at the fixed potential of 0.955 V against a reversible hydrogen electrode (RHE) is plotted as a function of scan rate while slope giving the value of the double-layer capacitance, C. The electrochemically active surface area of the sample can be determined to be 8 cm².

Figure 14A:
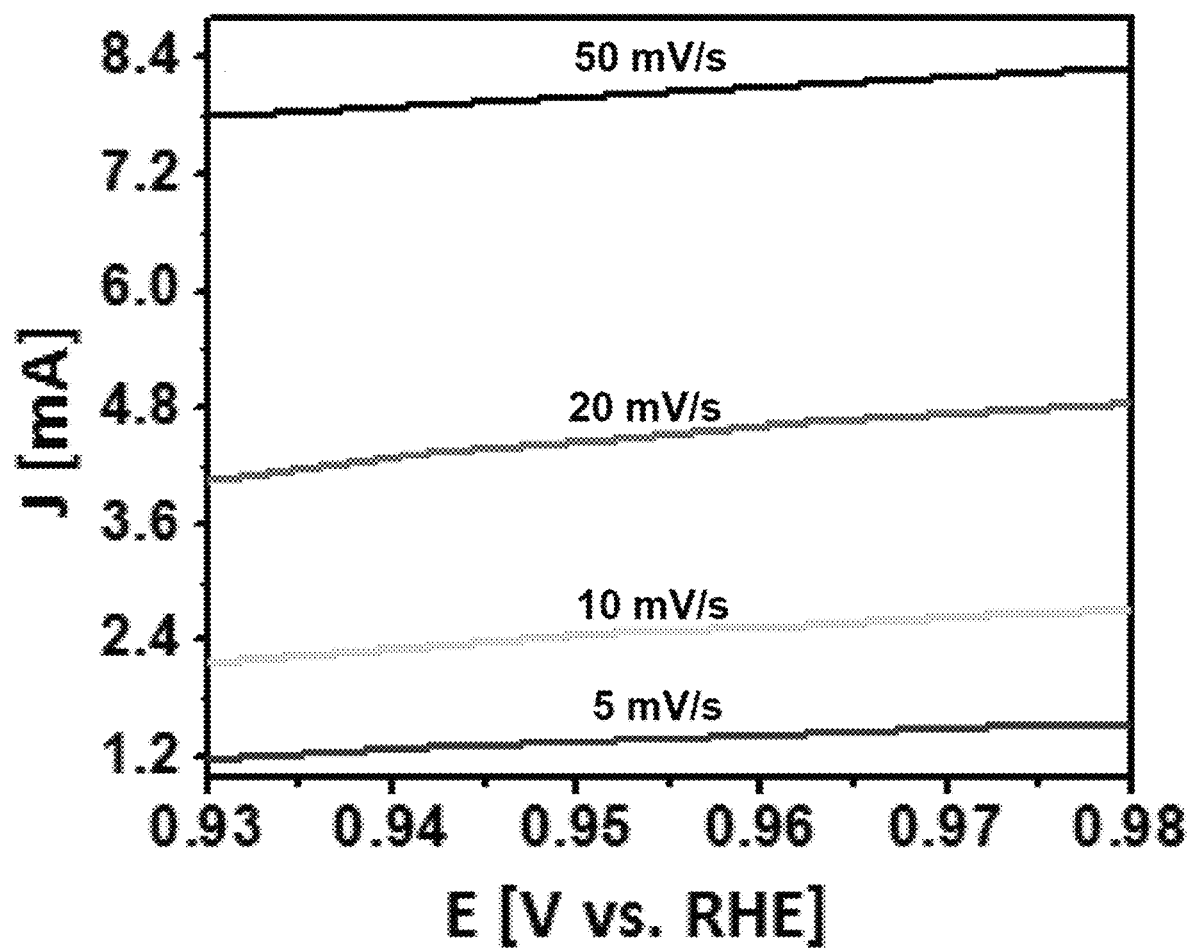
FIG. 14A shows a cyclic voltammogram for $Pd_{120}$ in a 0.1 M KOH electrolyte solution measured at varying scan rates, i.e., 5 mV/s, 10 mV/s, 20 mV/s, and 50 mV/s, in the non-faradaic region where all current should be due to capacitive charging.
Figure 14B:
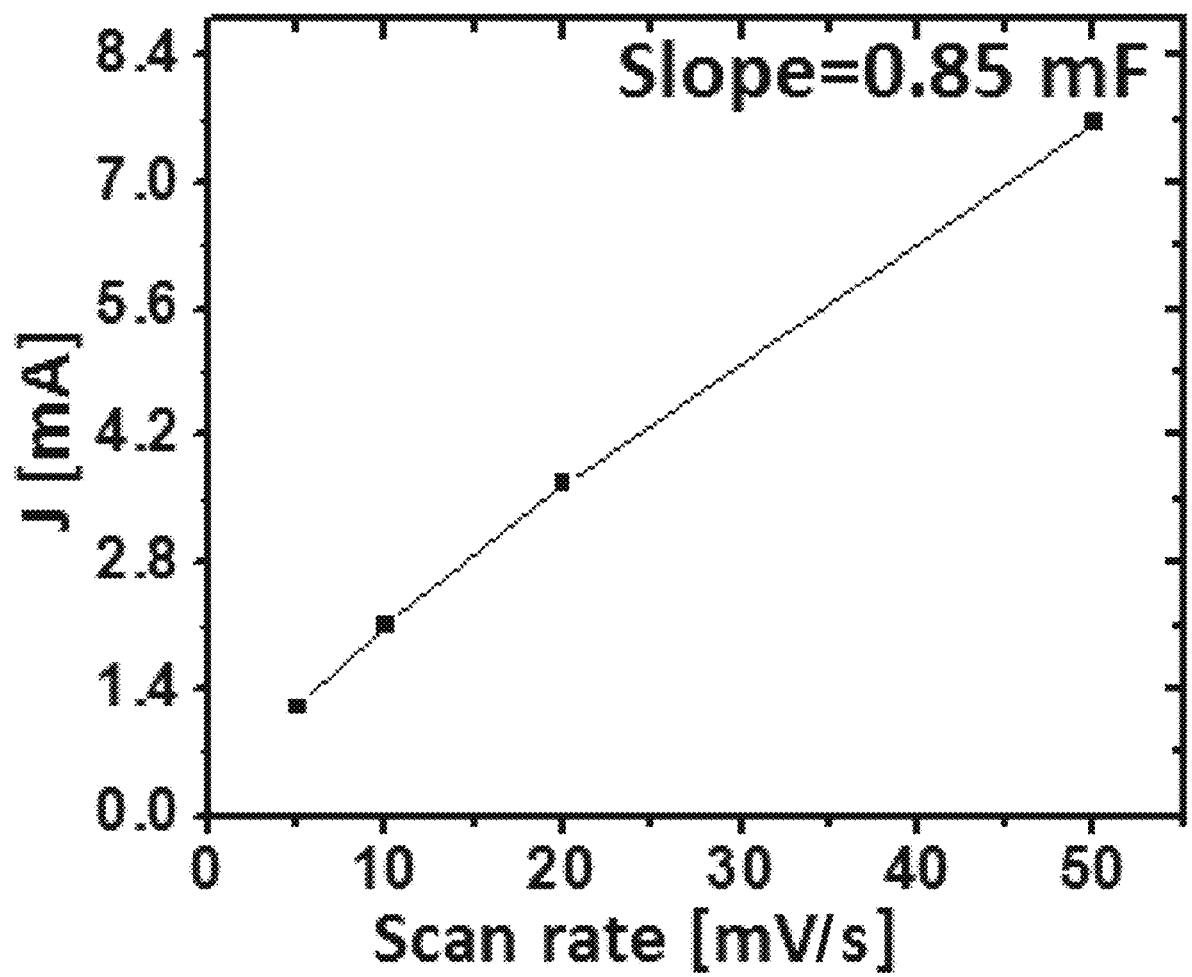
FIG. 14B shows a plot of current at a fixed potential of 0.955 V vs. RHE as a function of scan rate, with the slope giving the value of the double-layer capacitance, $C_{dl}$, and the electrochemically active surface area indicated to be 20 $cm^2$.

FIGS. 14A and 14B show double layer capacitance measurements for evaluating electrochemically active surface area for $Pd_{180}$ type electrocatalytic system in 0.1 M KOH electrolyte solution. FIG. 14A shows a cyclic voltammogram for $Pd_{180}$ measured at varying scan rate, exemplified using 5 mV/s, 10 mV/s, 20 mV/s, and 50 mV/s in the non-faradaic region, where all the current should be due to capacitive charging. FIG. 14B shows charging current at the fixed potential of 0.955 V against a reversible hydrogen electrode (RHE) is plotted as a function of scan rate while slope giving the value of the double-layer capacitance, $C_{dl}$. The electrochemically active surface area of the sample can be determined to be 20 cm².

Figure 15:
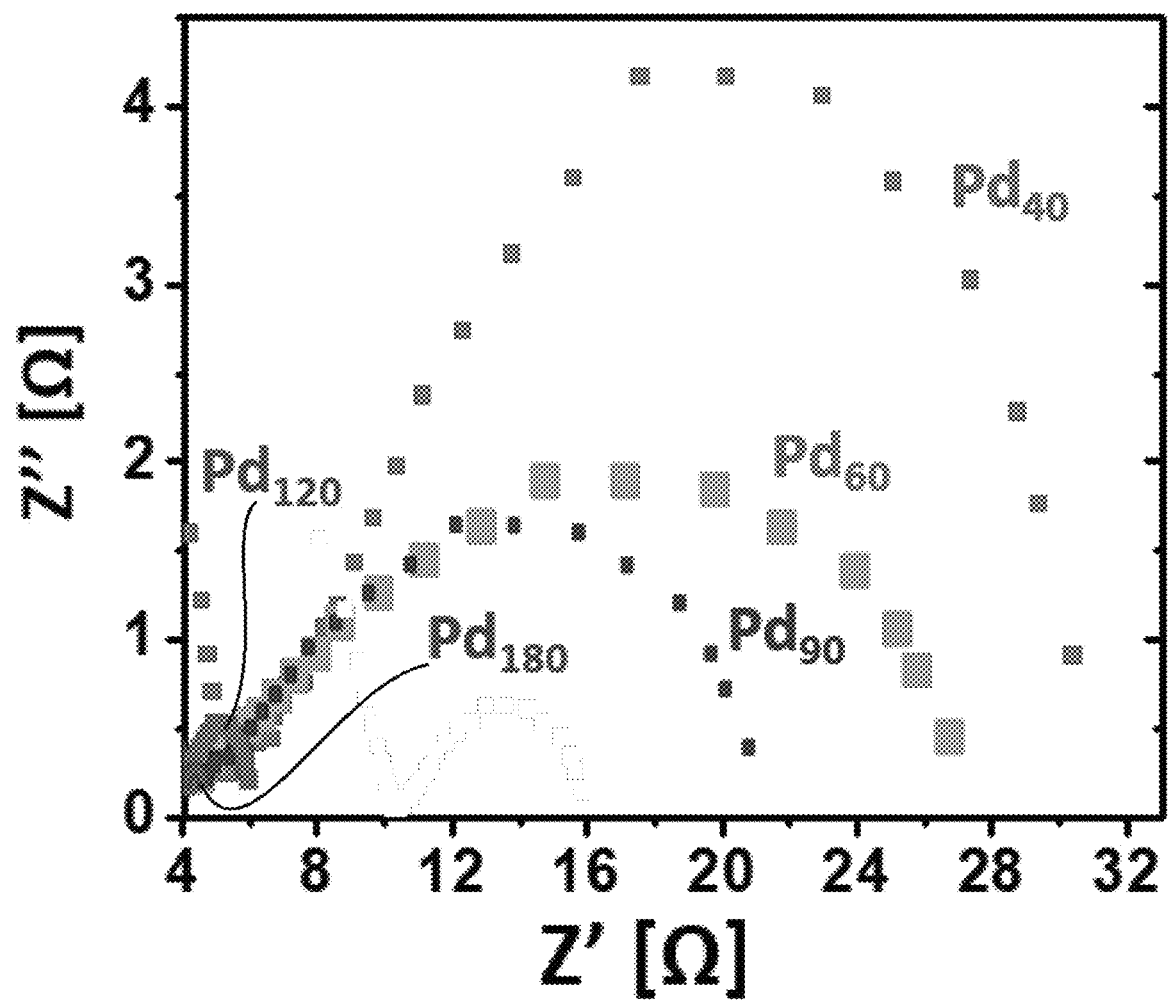
FIG. 15 shows a Nyquist plot for $Pd_{40}$, $Pd_{60}$, $Pd_{90}$, $Pd_{120}$, and for $Pd_{180}$ at an applied potential of 1.48 V vs. RHE in the frequency range of 0.1 Hz to 100 KHz, with an inset data fitting with a Randles circuit and Nova software for each EIS analysis.

FIG. 15 shows Nyquist plot for $Pd_{40}$, $Pd_{60}$, $Pd_{90}$, $Pd_{120}$, and for $Pd_{180}$ at an applied potential of 1.48 V against a reversible hydrogen electrode (RHE) in the frequency range of 0.1 Hz to 100 KHz. For each electrochemical impedance spectroscopy (EIS) analysis, data was fitted employing a Randles circuit with Nova software. The charge transfer resistance for $Pd_{40}$ was determined to be approximately 15Ω, for $Pd_{60}$ was determined to be approximately 13Ω, for $Pd_{90}$ was determined to be approximately 11Ω, for $Pd_{120}$ was determined to be approximately 61, and for $Pd_{180}$ was determined to be approximately 2.1Ω is estimated by fitting a simplified Randles circuit.

The open morphological structure and high crystallinity of the $Pd_{180}$ catalyst can support mass transfer and/or boost electron transfer without undergoing scattering losses. To gain further insight into the catalytic kinetics, impedance spectroscopy was undertaken. Electrochemical impedance spectroscopy (EIS) experiments of varying Pd film thicknesses indicate that the $Pd_{180}$ sample represents the lowest charge transfer resistance ($R_{ct}$), i.e., 2Ω, obtained from the x-axis intercept of the semicircle at the low-frequency region in FIG. 15. This feature corresponds to favorable charge transfer kinetics as seen in FIG. 15.

Numerous modifications and variations of the present invention are possible in light of the above teachings. It is therefore to be understood that within the scope of the appended claims, the invention may be practiced otherwise than as specifically described herein.

REFERENCE SIGNS 1 precursor suspension/solution
2 carrier gas supply
3 agitator (e.g., ultrasonic humidifier)
4 substrate (e.g., slides)
5 furnace (e.g., tube furnace)
6 reactor (e.g., tube)
7 gas trap
8 exhaust

The invention claimed is:

1. An oxygen evolution reaction catalyst electrode, comprising:
   a glass electrode;
   a first coating, directly upon the glass electrode, comprising a layer of fluorine-doped tin oxide (FTO)); and
   a second coating, directly upon the first coating, comprising a layer comprising at least 97.5 wt. % palladium, relative to a total weight of the second coating,
   wherein the palladium in the second coating is in the form of porous, spongy-textured clusters comprising palladium spheroid nanoparticles in cubic crystalline phase,
   wherein the nanoclusters in the second coating have a cauliflower morphology with frazzled tips and edges,
   wherein the second coating has a thickness in a range of from 0.5 to 10 μm,
   wherein the clusters have an average largest dimension in a range of from 500 nm to 10 μm, and
   wherein oxygen evolution reaction catalyst electrode has a mass activity in a range of from 500 to 750 mA/mg in oxygen evolution reactions.

2. The electrode of claim 1, wherein the second coating has a thickness in a range of from 1 to 7.5 μm,
   wherein the second coating has a porosity of at least 50%, and
   wherein the nanoclusters comprise microstructures made of spicules of sponge shaped clusters sized in a range of from 100 to 975 nm.

3. The electrode of claim 1, wherein the second coating has an XRD pattern with a (111) plane peak, in a range of from 39 to 41°, and a (200) plane peak, in a range of from 46 to 48°,
   wherein the (111) plane peak relative to the (200) plane peak has a height ratio in a range of from 3:1 to 1.5:1.

4. The electrode of claim 1, wherein the second coating has an XRD pattern comprising only:
   a first 2θ peak in a range of from 39 to 41°;
   a second 2θ peak in a range of from 46 to 48°;
   a third 2θ peak in a range of from 67 to 69°;
   a fourth 2θ peak in a range of from 81 to 83°; and
   a fifth 2θ peak in a range of from 86 to 88°.

5. The electrode of claim 1, comprising no more than 2.5 wt. % palladium oxide, relative to all palladium present in the catalyst.

6. The electrode of claim 1, wherein the second coatings consists essentially of Pd.

7. The electrode of claim 1, comprising no further coatings than the first and second coatings.

8. The electrode of claim 1, wherein the second coating has an electroactive surface area in a range of from 15 to 30 cm$^2$.

9. The electrode of claim 1, wherein the second coating has an OER overpotential of no more than 225 mV at 1.43 V against a reversible hydrogen electrode.

10. The electrode of claim 1, wherein the average largest dimension of the clusters is in a range of from 1 to 5 μm.

11. The electrode of claim 1, comprising no active catalytic metals besides Pd.

12. An electrochemical cell, comprising the oxygen evolution reaction catalyst electrode of claim 1 as a working electrode.

13. A method of conducting the oxygen evolution reaction, comprising contacting water with the oxygen evolution reaction catalyst electrode of claim 1.

* * * * *